(12) United States Patent
Chen et al.

(10) Patent No.: US 12,389,603 B2
(45) Date of Patent: Aug. 12, 2025

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Liang Chen, Wuhan (CN); Shiqi Huang, Wuhan (CN); Wei Liu, Wuhan (CN); Yanhong Wang, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 653 days.

(21) Appl. No.: 17/846,612

(22) Filed: Jun. 22, 2022

(65) Prior Publication Data

US 2023/0157027 A1 May 18, 2023

Related U.S. Application Data

(63) Continuation of application No. PCT/CN2022/096598, filed on Jun. 1, 2022.

(30) Foreign Application Priority Data

Nov. 18, 2021 (CN) .......................... 202111369252.8
Nov. 18, 2021 (CN) .......................... 202111369255.1
Nov. 18, 2021 (CN) .......................... 202111371139.3

(51) Int. Cl.
*H10B 43/50* (2023.01)
*H10B 43/10* (2023.01)
*H10B 43/27* (2023.01)

(52) U.S. Cl.
CPC ............. *H10B 43/50* (2023.02); *H10B 43/10* (2023.02); *H10B 43/27* (2023.02)

(58) Field of Classification Search
CPC ......... H10B 43/10; H10B 43/27; H10B 43/50
See application file for complete search history.

(56) References Cited

U.S. PATENT DOCUMENTS

| | | | |
|---|---|---|---|
| 2017/0186767 A1 | 6/2017 | Baek et al. | |
| 2020/0152653 A1* | 5/2020 | Lu | ...................... H01L 23/535 |
| 2023/0036595 A1* | 2/2023 | Thimmegowda | ...... H10B 41/10 |

FOREIGN PATENT DOCUMENTS

| | | |
|---|---|---|
| CN | 106206593 A | 12/2016 |
| CN | 106910746 A | 6/2017 |

(Continued)

OTHER PUBLICATIONS

Supplemental Search Report issued in corresponding EP Application No. 22817512.1, mailed Dec. 12, 2023, 10 pages.

(Continued)

*Primary Examiner* — Daniel P Shook
(74) *Attorney, Agent, or Firm* — BAYES PLLC

(57) ABSTRACT

A three-dimensional (3D) memory device includes a plurality of memory stacks arranged along a first direction, and a dummy block structure disposed between two adjacent memory stacks. Each memory stack includes a plurality of first conductive layers and a plurality of first dielectric layers alternately stacked along a second direction perpendicular to the first direction. A channel structure extends through the plurality of first conductive layers and the plurality of first dielectric layers along the second direction. A first isolation structure is disposed between the dummy block structure and one of the plurality of memory stacks. A substrate is disposed under the plurality of memory stacks, the dummy block structure, and the first isolation structure. A second isolation structure is disposed in the substrate extending along the second direction.

20 Claims, 19 Drawing Sheets

(56) References Cited

FOREIGN PATENT DOCUMENTS

| | | | |
|---|---|---|---|
| CN | 107017264 | A | 8/2017 |
| CN | 111883534 | A | 11/2020 |
| CN | 112310095 | A | 2/2021 |
| CN | 112786566 | A | 5/2021 |
| CN | 114038860 | A | 2/2022 |
| CN | 114038861 | A | 2/2022 |
| CN | 114093811 | A | 2/2022 |
| WO | 2021155611 | A1 | 8/2021 |

OTHER PUBLICATIONS

International Search Report issued in corresponding International Application No. PCT/CN2022/096598, mailed Aug. 3, 2022, 4 pages.

* cited by examiner

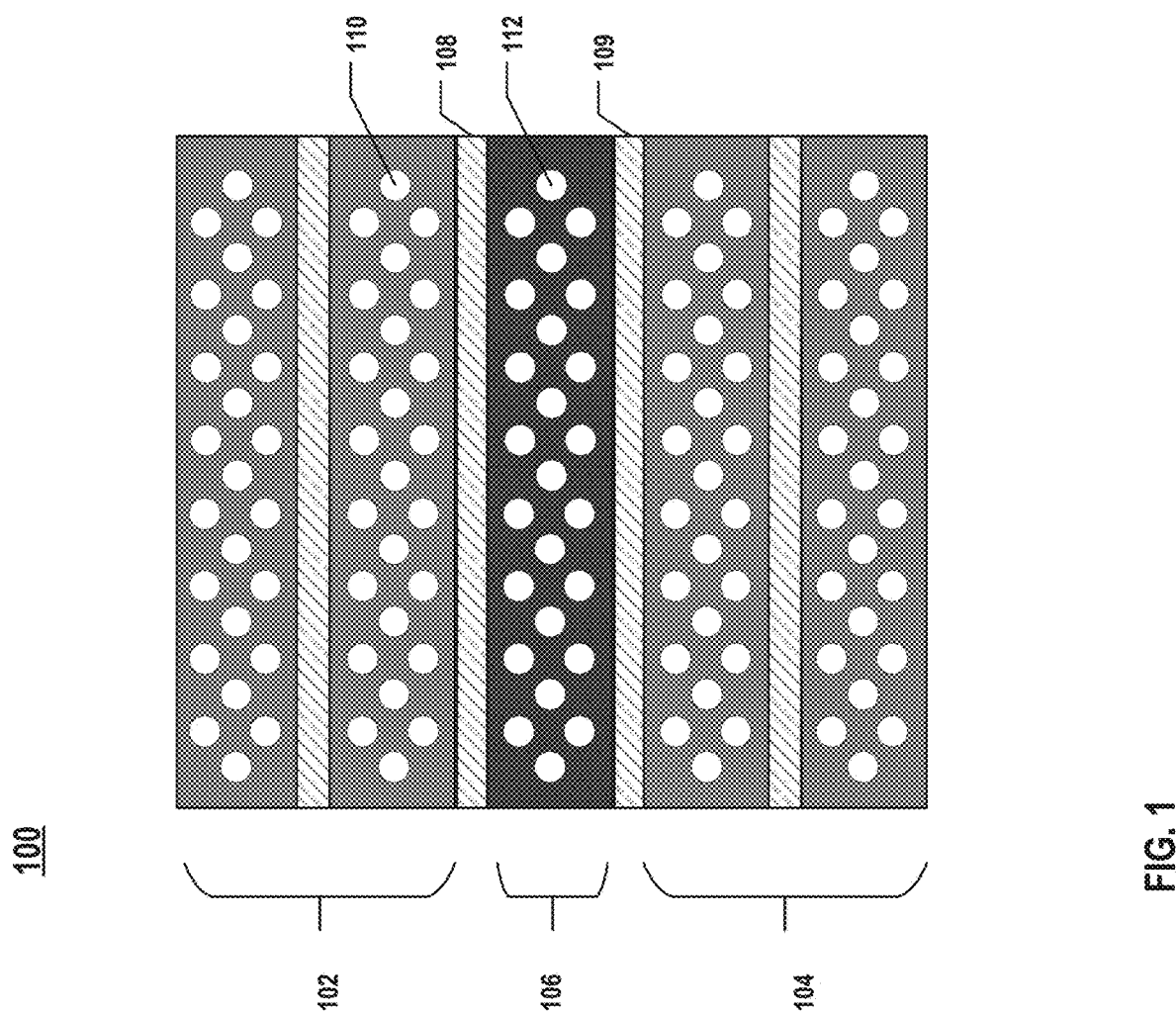
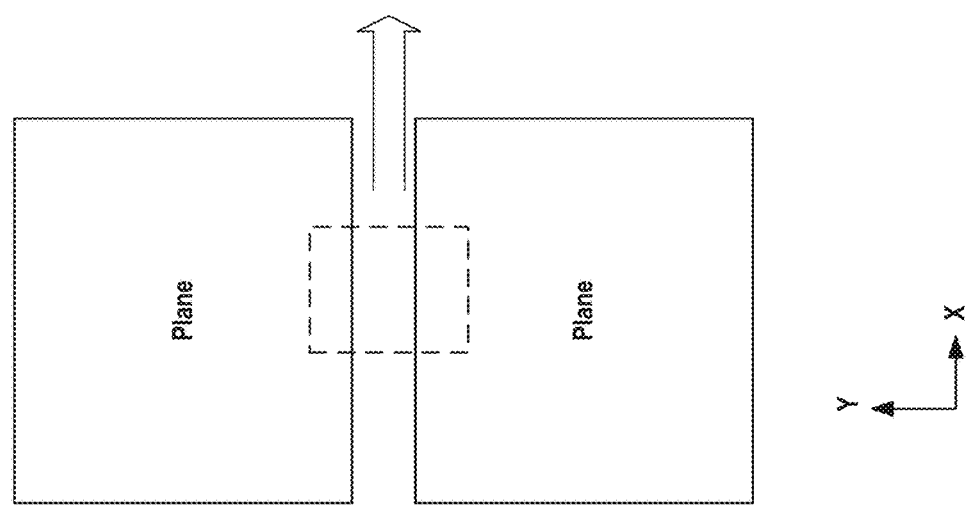
FIG. 1

THREE-DIMENSIONAL MEMORY DEVICE AND METHOD FOR FORMING THE SAME

CROSS-REFERENCE TO RELATED APPLICATIONS

This application is a continuation of International Application No. PCT/CN2022/096598, filed on Jun. 1, 2022, entitled "THREE-DIMENSIONAL MEMORY DEVICE AND METHOD FOR FORMING THE SAME," which claims the benefit of priorities to CN Application No. 202111369255.1, filed on Nov. 18, 2021, CN Application No. 202111369252.8, filed on Nov. 18, 2021, and CN Application No. 202111371139.3, filed on Nov. 18, 2021, all of which are hereby incorporated by references in their entireties.

BACKGROUND

The present disclosure relates to memory devices and methods for forming memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) semiconductor device architecture can address the density limitation in some planar semiconductor devices, for example, Flash memory devices.

SUMMARY

Implementations of 3D memory device and method for forming the same are disclosed herein.

In one aspect, a 3D memory device is disclosed. The 3D memory device includes a plurality of memory stacks, a dummy structure, a first isolation structure, a second isolation structure, a semiconductor layer, and a trench isolation structure. The plurality of memory stacks include a first memory stack and a second memory stack arranged along a first direction. Each memory stack includes a plurality of first conductive layers and a plurality of first dielectric layers alternately stacked along a second direction perpendicular to the first direction, and a channel structure extending through the plurality of first conductive layers and the plurality of first dielectric layers along the second direction. The dummy structure is disposed between the first memory stack and the second memory stack. The dummy structure extends along a second direction perpendicular to the first direction and a third direction perpendicular to the first direction and the second direction. The first isolation structure is disposed between the dummy structure and the first memory stack, and the first isolation structure extends along the second direction and the third direction. The second isolation structure is disposed between the dummy structure and the second memory stack, and the second isolation structure extends along the second direction and the third direction. The semiconductor layer is disposed under the plurality of memory stacks, the dummy structure, the first isolation structure, and the second isolation structure. The trench isolation structure is disposed in the semiconductor layer extending along the second direction and the third direction.

In some implementations, the dummy structure includes a plurality of second conductive layers and a plurality of second dielectric layers alternately stacked along the second direction.

In some implementations, the plurality of first conductive layers and the plurality of second conductive layers are same layers, and the plurality of first dielectric layers and the plurality of second dielectric layers are same layer.

In some implementations, the dummy structure further includes a dummy channel structure extending through the plurality of second conductive layers and the plurality of second dielectric layers along the second direction, wherein the dummy channel structure includes a semiconductor channel and a memory film formed over the semiconductor channel.

In some implementations, the dummy structure further includes a contact structure extending through the plurality of second conductive layers and the plurality of second dielectric layers along the second direction.

In some implementations, the contact structure further includes a contact extending through the plurality of second conductive layers and the plurality of second dielectric layers along the second direction, and a third dielectric layer extending along the second direction surrounding the contact.

In some implementations, a third conductive layer is disposed in the semiconductor layer extending along the second direction under the contact, wherein the third conductive layer is in electric contact with the contact and is surrounded by a third dielectric layer.

In some implementations, the trench isolation structure electrically isolates the semiconductor layer under each memory stack.

In some implementations, the trench isolation structure is disposed under the first and the second isolation structures and aligns to the first and the second isolation structures.

In some implementations, the trench isolation structure is disposed under the dummy structure.

In some implementations, the first isolation structure further includes a gate line slit extending along the second direction and the third direction.

In some implementations, the first isolation structure electrically isolates the plurality of first conductive layers and the plurality of second conductive layers.

In another aspect, a system is disclosed. The system includes a 3D memory device configured to store data, and a memory controller. The 3D memory device includes a plurality of memory stacks, a dummy structure, a first isolation structure, a second isolation structure, a semiconductor layer, and a trench isolation structure. The plurality of memory stacks include a first memory stack and a second memory stack arranged along a first direction. Each memory stack includes a plurality of first conductive layers and a plurality of first dielectric layers alternately stacked along a second direction perpendicular to the first direction, and a channel structure extending through the plurality of first conductive layers and the plurality of first dielectric layers along the second direction. The dummy structure is disposed between the first memory stack and the second memory stack. The dummy structure extends along a second direction perpendicular to the first direction and a third direction perpendicular to the first direction and the second direction. The first isolation structure is disposed between the dummy structure and the first memory stack, and the first isolation structure extends along the second direction and the third direction. The second isolation structure is disposed between the dummy structure and the second memory stack, and the second isolation structure extends along the second direction and the third direction. The semiconductor layer is disposed under the plurality of memory stacks, the dummy structure, the first isolation structure, and the second isolation structure. The trench isolation structure is disposed in the semiconductor layer extending along the second direction and the third direction. The memory controller is coupled to the 3D memory device and is configured to control operations of the 3D memory device.

In still another aspect, a method for forming a 3D memory device is disclosed. A stack structure including a plurality of first dielectric layers and a plurality of sacrificial layers alternatingly arranged on a semiconductor layer is formed. The stack structure includes a plurality of stack structures arranged along a first direction. A plurality of channel structures are formed in the stack structure along a second direction perpendicular to the first direction. A first slit and a second slit are formed in the stack structure from an upper side of the stack structure along the second direction and a third direction perpendicular to the first direction and the second direction, wherein the plurality of stack structures are zoned into a first memory region, a second memory region, and a dummy region by the first slit and the second slit, the dummy region is disposed between the first memory region and the second memory region, the first slit is disposed between the first memory region and the dummy region, and the second slit is disposed between the second memory region and the dummy region. The plurality of sacrificial layers are replaced with a plurality of conductive layers. A first isolation structure is formed in the first slit and a second isolation structure is formed in the second slit. A third isolation structure is formed in the semiconductor layer under the first isolation structure and a fourth isolation structure is formed in the semiconductor layer under the second isolation structure.

In some implementations, the plurality of channel structures are formed in the first memory region, the second memory region, and the dummy region along the second direction.

In some implementations, the plurality of channel structures are formed in the first memory region and the second memory region. A contact structure is formed in the dummy region along the second direction.

In some implementations, a first gate line slit structure is formed in the first slit and a second gate line slit structure is formed in the second slit.

In some implementations, a second dielectric layer is formed in the first slit and a third dielectric layer is formed in the second slit.

In some implementations, an opening is formed in the semiconductor layer under the first isolation structure and the second isolation structure from a bottom side of the stack structure opposite to the upper side. A fourth dielectric layer is formed in the opening.

In some implementations, the first isolation structure electrically isolates the plurality of conductive layers between the first memory region and the dummy region, and the second isolation structure electrically isolates the plurality of conductive layers between the second memory region and the dummy region In some implementations, the third isolation structure electrically isolates the semiconductor layer under the first memory region and the dummy region, and the fourth isolation structure electrically isolates the semiconductor layer under the second memory region and the dummy region.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 1 illustrates a plan view of an exemplary 3D memory device, according to some aspects of the present disclosure.

Figure 2:
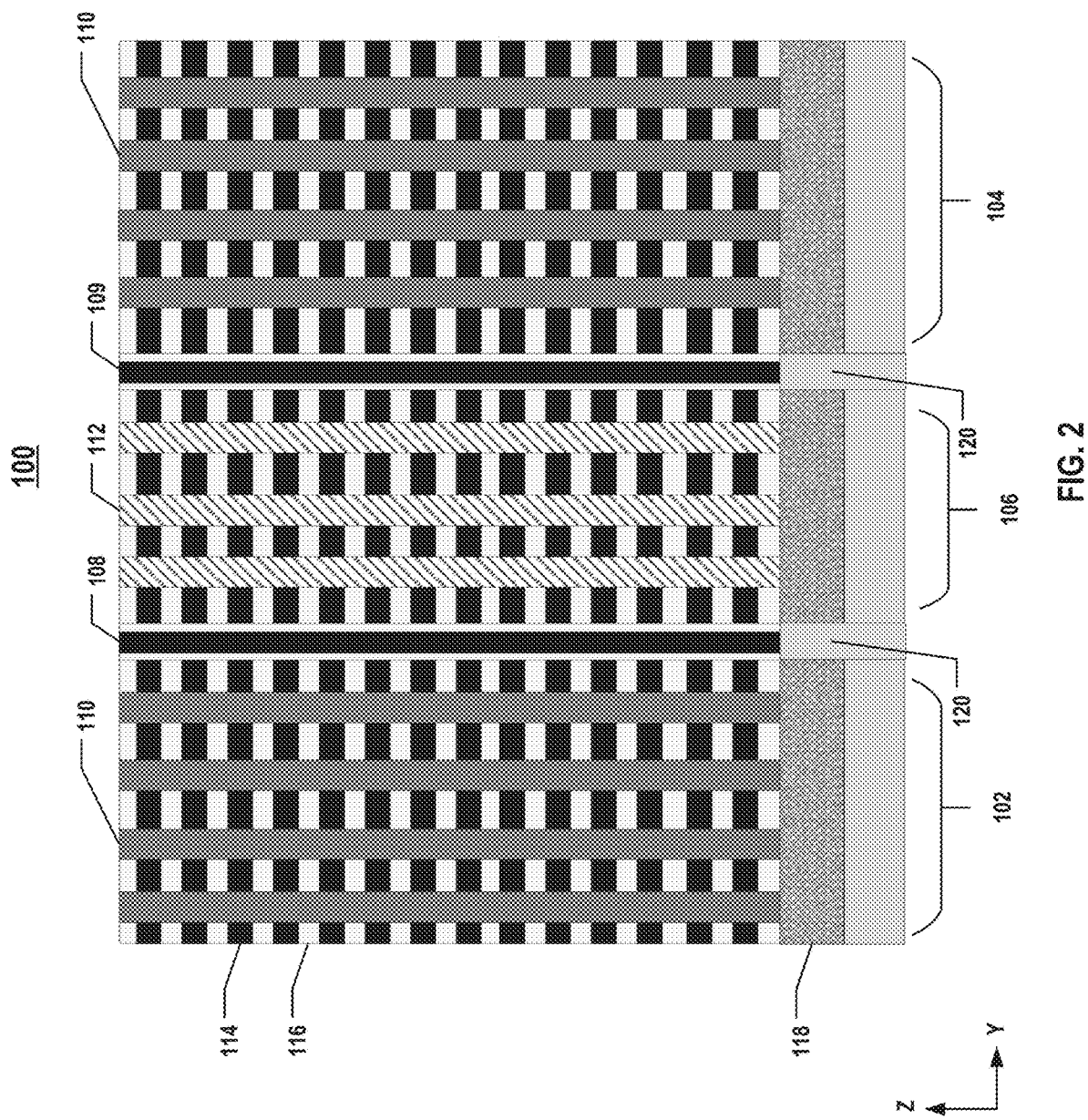
FIG. 2 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

A 3D semiconductor device can be formed by stacking semiconductor wafers or dies and interconnecting them vertically so that the resulting structure acts as a single device to achieve performance improvements at reduced power and a smaller footprint than conventional planar processes. However, the charge lateral migration issue becomes a major issue of the 3D semiconductor device. In some 3D memory devices, such as 3D NAND memory devices, a stack of devices includes memory array devices and peripheral devices. As the shrinkage of the device size and thickness, the distance between the word lines becomes smaller and smaller. Hence, the charge lateral migration issue in the channel structure is one of the bottlenecks of the 3D NAND memory devices.

FIG. 1 illustrates a plan view of an exemplary 3D memory device 100, according to some aspects of the present disclosure. As shown in FIG. 1, 3D memory device 100 includes a plurality of planes and a dummy region is formed between two adjacent planes along the y-direction. In some implementations, 3D memory device 100 is divided into a first memory region 102, a second memory region 104, and a dummy region 106. A first isolation structure 108 is disposed between first memory region 102 and dummy region 106, and a second isolation structure 109 is disposed between second memory region 104 and dummy region 106. First isolation structure 108 and second isolation structure 109 may extend along the x-direction and the z-direction. A plurality of channel structures 110 may be formed in first memory region 102 and second memory region 104. Channel structures 110 may extend along the z-direction perpendicular to the x-direction and the y-direction. A plurality of dummy channel structures 112 may be formed in dummy region 106. Similarly, dummy channel structures 112 may extend along the z-direction perpendicular to the x-direction and the y-direction.

FIG. 2 illustrates a cross-section of 3D memory device 100, according to some aspects of the present disclosure. First memory region 102, dummy region 106, and second memory region 104 are arranged along the y-direction on a substrate 118. In some implementations, substrate 118 can be a semiconductor layer. In some implementations, substrate 118 may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 118 may be a thinned substrate (e.g., a semiconductor layer), which was thinned by grinding, wet/dry etching, chemical mechanical polishing (CMP), or any combination thereof.

First isolation structure 108 and second isolation structure 109 are formed between first memory region 102 and dummy region 106, and between second memory region 104 and dummy region 106. Each of first memory region 102 and second memory region 104 may include a plurality of first conductive layers 114 (such as the word lines) and a plurality of first dielectric layers 116 alternately stacked along the z-direction. In some implementations, dummy region 106 may include a plurality of conductive layers and a plurality of dielectric layers alternately stacked along the z-direction. In some implementations, the plurality of conductive layers and the plurality of dielectric layers formed in dummy region 106 may be formed in the same processes with first conductive layers 114 and first dielectric layers 116 in first memory region 102 and second memory region 104.

In other words, even though the conductive layers and the dielectric layers are divided in first memory region 102, second memory region 104, and dummy region 106, the conductive layers and the dielectric layers may be formed together during the manufacturing process.

In some implementations, first conductive layers 114 may form the word lines and may include conductive materials including, but not limited to, tungsten (W), cobalt (Co), copper (Cu), aluminum (Al), polysilicon, doped silicon, silicides, or any combination thereof. In some implementations, first dielectric layers 116 may include dielectric materials including, but not limited to, silicon oxide, silicon nitride, silicon oxynitride, or any combination thereof.

In some implementations, channel structures 110 may include a semiconductor channel and a memory film formed over the semiconductor channel. The meaning of "over" here, besides the explanation stated above, should also be interpreted "over" something from the top side or from the lateral side. The memory film may be a multilayer structure and is an element to achieve the storage function in 3D memory device 100. The memory film may include a composite layer of silicon oxide/silicon oxynitride/silicon oxide (ONO). The ONO structure may be formed on the surface of the semiconductor channel, and the ONO structure (the memory film) is also located between the semiconductor channel and first conductive layers 114, such as word lines. In some implementations, the semiconductor channel may include silicon, such as amorphous silicon, polysilicon, or single crystalline silicon.

Figure 5:
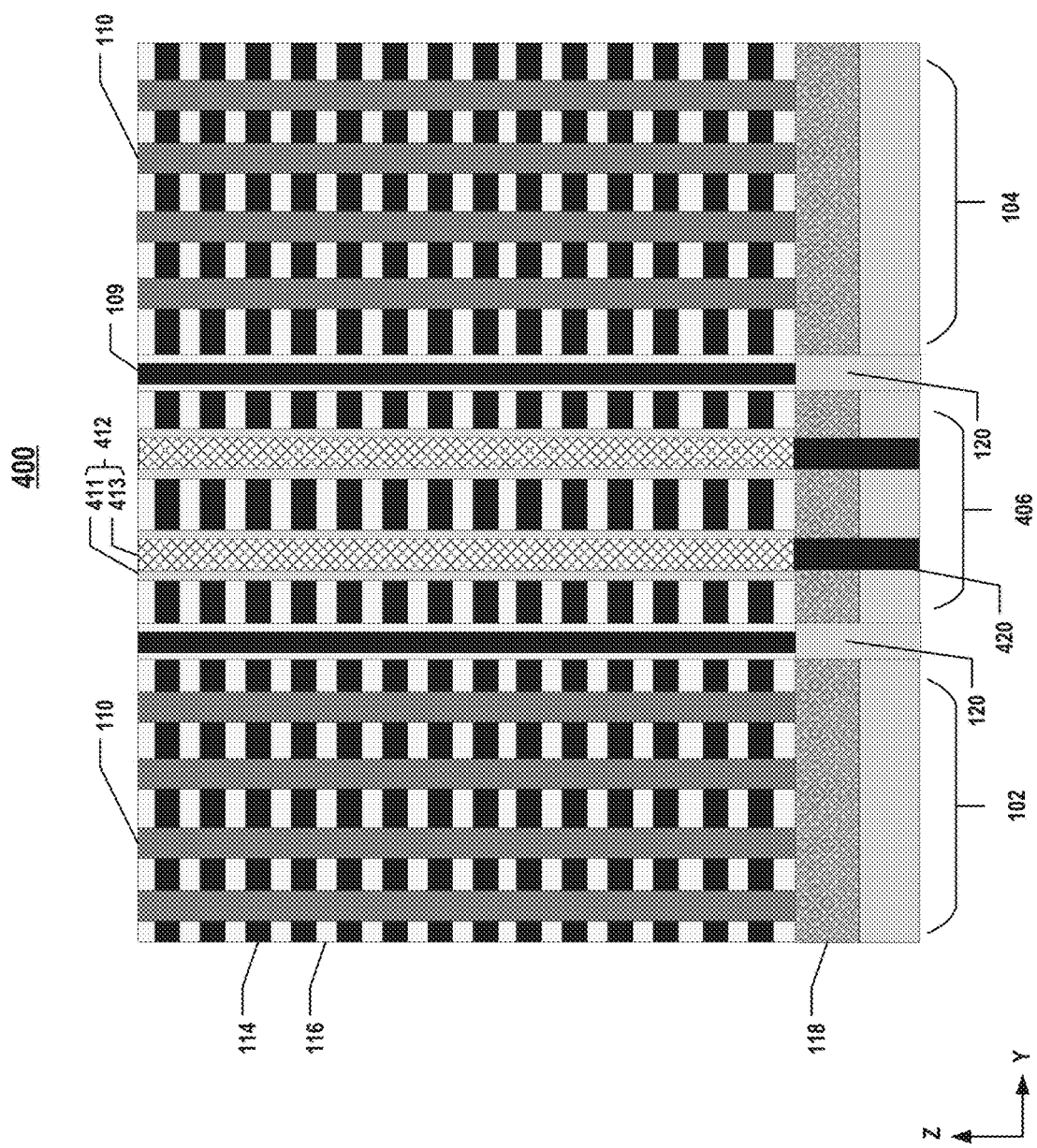
FIG. 5 illustrates a cross-section of yet another exemplary 3D memory device, according to some aspects of the present disclosure.
Figure 9:
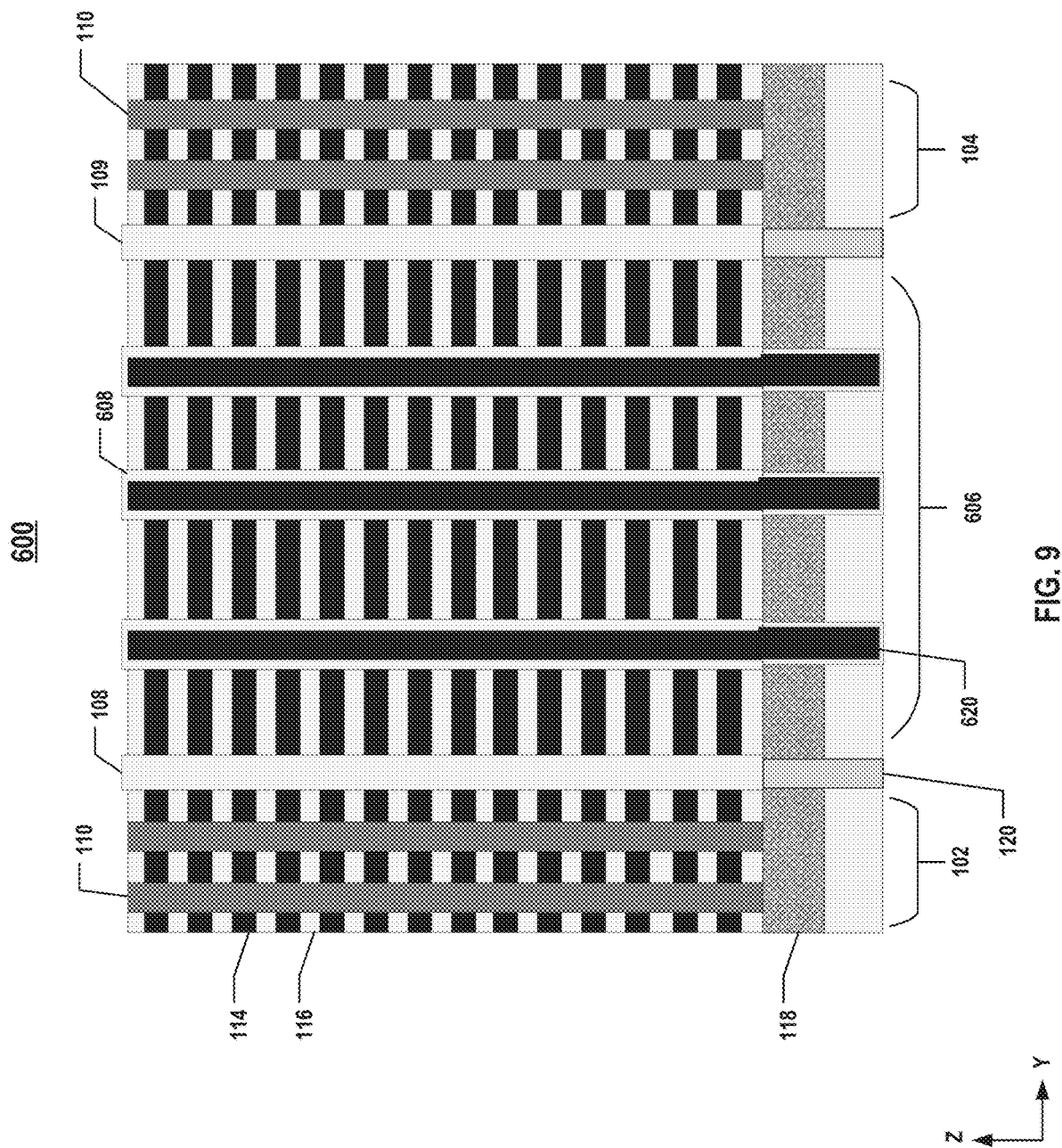
FIG. 9 illustrates a cross-section of yet another exemplary 3D memory device, according to some aspects of the present disclosure.

In some implementations, dummy channel structures 112 may have the same structure with channel structures 110, as shown in FIG. 2. In some implementations, dummy channel structures 112 and channel structures 110 may have different structures, as shown in FIG. 5 or FIG. 9.

In some implementations, first isolation structure 108 may extend along the z-direction and the x-direction between first memory region 102 and dummy region 106, and second isolation structure 109 may extend along the z-direction and the x-direction between second memory region 104 and dummy region 106. In some implementations, first isolation structure 108 and second isolation structure 109 may include a gate line slit structure. The gate line slit structure may extend along the z-direction through the memory stacks and may also extend along the x-direction to separate the memory stacks into multiple blocks. In some implementations, the gate line slit structure may include a slit contact, formed by filling the slit opening with conductive materials including but not limited to W, Co, Cu, Al, polysilicon, silicides, or any combination thereof. The gate line slit structure may further include a composite spacer disposed laterally between the slit contact and first conductive layers 114 and first dielectric layers 116 to electrically insulate the gate line slit structure from surrounding first conductive layers 114 (the gate conductors in the memory stacks). As a result, the gate line slit structure, including first isolation structure 108 and second isolation structure 109, electrically separates the memory stacks in first memory region 102, dummy region 106, and second memory region 104.

In some implementations, first isolation structure 108 and second isolation structure 109 may include a barrier structure formed by dielectric materials. The barrier structure may extend vertically along the z-direction through the memory stacks and may also extend laterally along the x-direction to separate the memory stacks into multiple blocks. In some implementations, the barrier structure may include one or multiple dielectric layers to electrically separates the memory stacks in first memory region 102, dummy region 106, and second memory region 104.

As shown in FIG. 2, 3D memory device 100 may further include a third isolation structure 120. In some implementations, third isolation structure 120 may be formed in substrate 118 extending along the z-direction. In some implementations, third isolation structure 120 may be a trench isolation structure formed in substrate 118. In some implementations, third isolation structure 120 may be formed by dielectric materials. Third isolation structure 120 may electrically isolate substrate 118 in first memory region 102, dummy region 106, and second memory region 104. When substrate 118 is formed by semiconductor materials, e.g., silicon, the well regions of the semiconductor substrate under different memory stacks need to be electrically isolated. In some implementations, third isolation structure 120 may align to first isolation structure 108 and second isolation structure 109 in the z-direction. In some implementations, third isolation structure 120 may not align to first isolation structure 108 and second isolation structure 109 in the z-direction, and the well regions of the semiconductor substrate under different memory stacks are isolated by third isolation structure 120. By forming second isolation structure 120, the well regions of substrate 118 under different memory stacks can be electrically isolated without a complicated structure.

Figure 3:
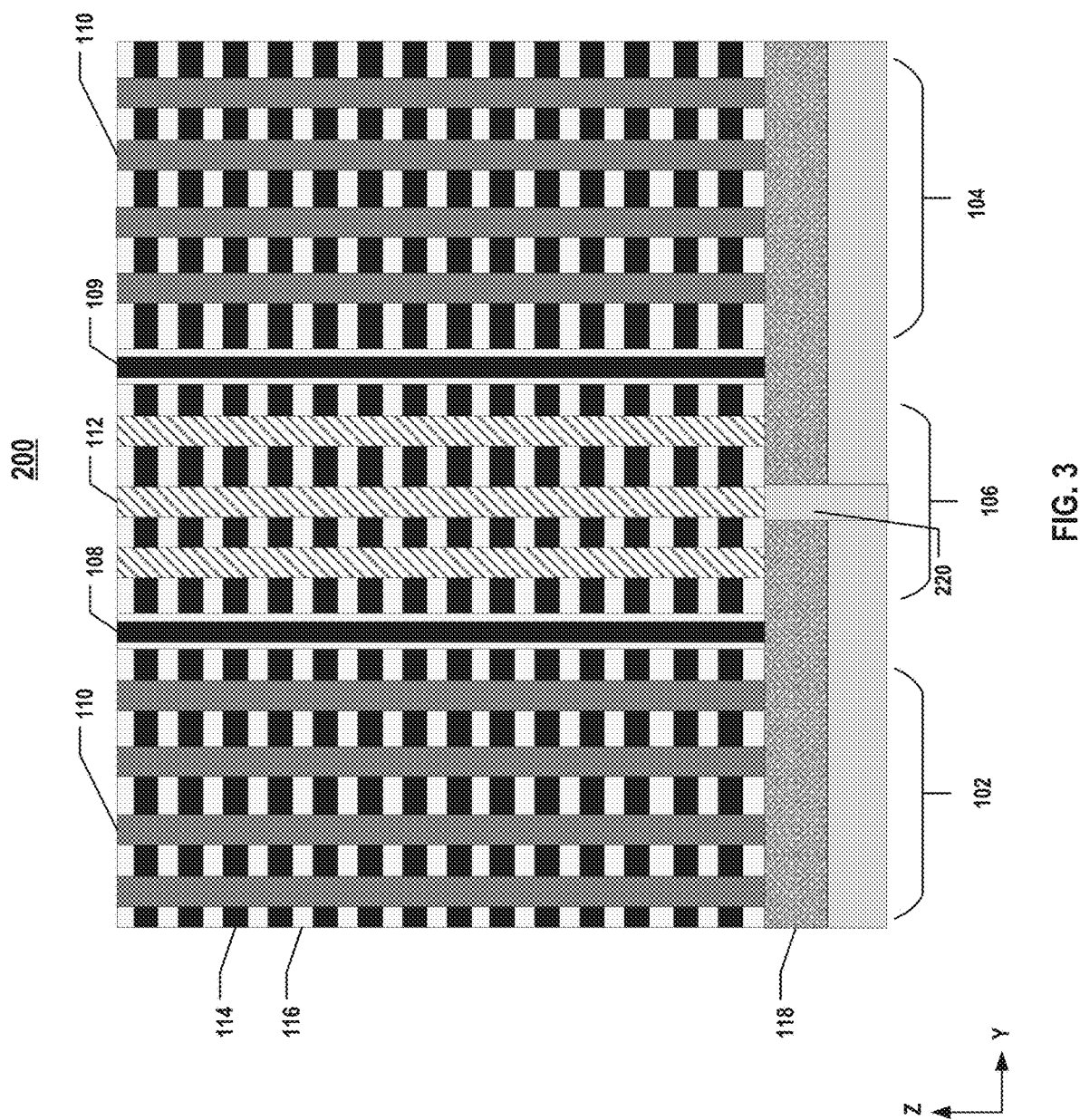
FIG. 3 illustrates a cross-section of another exemplary 3D memory device, according to some aspects of the present disclosure.

FIG. 3 illustrates a cross-section of another exemplary 3D memory device 200, according to some aspects of the present disclosure. The structure of 3D memory device 200 may be similar to the structure of 3D memory device 100. However, 3D memory device 200 may include a fourth isolation structure 220, which does not align to first isolation structure 108 or second isolation structure 109.

As shown in FIG. 3, fourth isolation structure 220 may be formed in substrate 118 extending along the z-direction. In some implementations, fourth isolation structure 220 may be formed by dielectric materials. Fourth isolation structure 220 may electrically isolate substrate 118 in first memory region 102, and second memory region 104. In some implementations, fourth isolation structure 220 may be formed in dummy region 106. In some implementations, fourth isolation structure 220 may align to dummy channel structures 112. In some implementations, fourth isolation structure 220 may not align to dummy channel structures 112. By forming fourth isolation structure 220, the well regions of substrate 118 under different memory stacks can be electrically isolated without a complicated structure.

Figure 4:
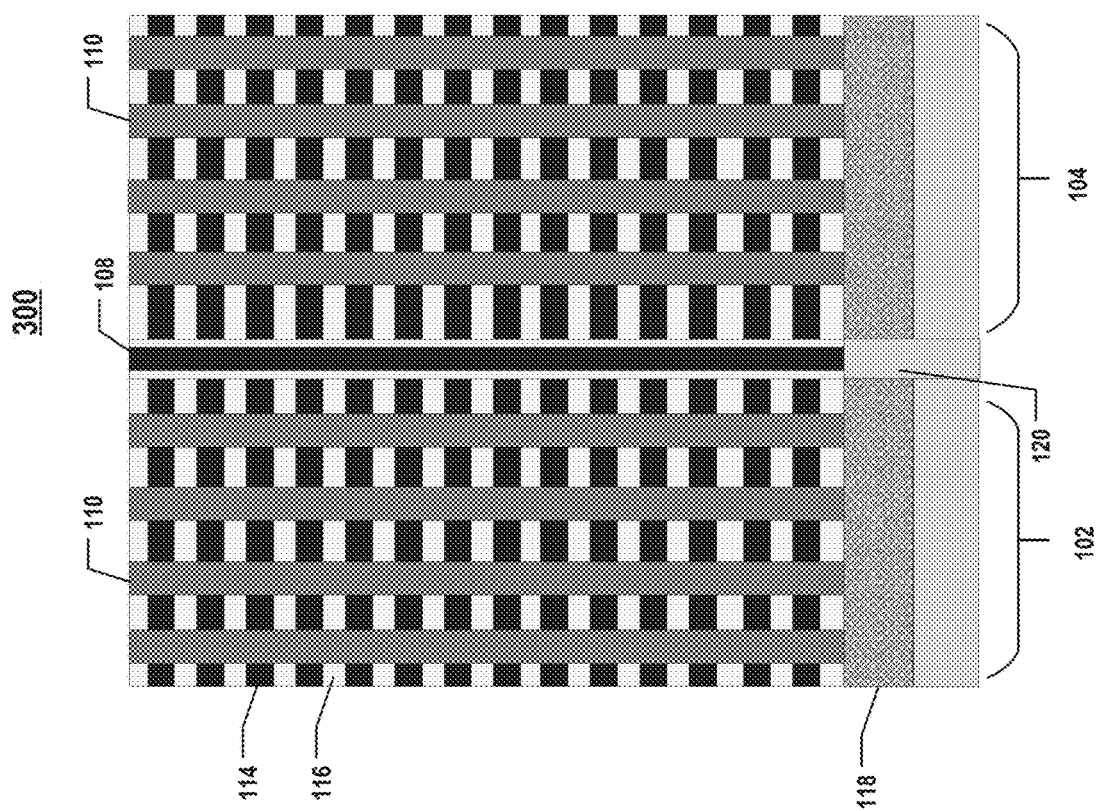
FIG. 4 illustrates a cross-section of still another exemplary 3D memory device, according to some aspects of the present disclosure.

FIG. 4 illustrates a cross-section of still another exemplary 3D memory device 300, according to some aspects of the present disclosure. The structure of 3D memory device 300 may be similar to the structure of 3D memory device 100. However, 3D memory device 300 does not include the dummy region.

As shown in FIG. 4, first memory region 102 and second memory region 104 are arranged along the y-direction on a substrate 118. In some implementations, substrate 118 may include silicon (e.g., single crystalline silicon), SiGe, GaAs, Ge, SOI, GOI, or any other suitable materials. In some implementations, substrate 118 may be a thinned substrate (e.g., a semiconductor layer), which was thinned by grinding, wet/dry etching, CMP, or any combination thereof. First isolation structure 108 is formed between first memory region 102 and second memory region 104. Each of first memory region 102 and second memory region 104 may include first conductive layers 114 (such as the word lines) and first dielectric layers 116 alternately stacked along the z-direction. In some implementations, channel structures 110 may include a semiconductor channel, and a memory film formed over the semiconductor channel.

In some implementations, first isolation structure 108 may extend vertically along the z-direction and the x-direction between first memory region 102 and second memory region. In some implementations, first isolation structure 108 may include a gate line slit structure. The gate line slit structure may extend vertically along the z-direction through the memory stacks and may also extend laterally along the x-direction to separate the memory stacks into multiple blocks. In some implementations, the gate line slit structure may include a slit contact, formed by filling the slit opening with conductive materials including but not limited to, W, Co, Cu, Al, polysilicon, silicides, or any combination thereof. The gate line slit structure may further include a composite spacer disposed laterally between the slit contact and first conductive layers 114 and first dielectric layers 116 to electrically insulate the gate line slit structure from surrounding first conductive layers 114 (the gate conductors in the memory stacks). As a result, the gate line slit structure electrically separates the memory stacks in first memory region 102 and second memory region 104.

In some implementations, first isolation structure 108 may include a barrier structure formed by dielectric materials. The barrier structure may extend vertically along the z-direction through the memory stacks and may also extend laterally along the x-direction to separate the memory stacks into multiple blocks. In some implementations, the barrier structure may include one or multiple dielectric layers to electrically separates the memory stacks in first memory region 102 and second memory region 104.

As shown in FIG. 4, third isolation structure 120 may be formed in substrate 118 extending along the z-direction aligning to first isolation structure 108. In some implementations, third isolation structure 120 may be formed in substrate 118 extending along the z-direction not aligning to first isolation structure 108. In some implementations, third isolation structure 120 may be formed by dielectric material that may electrically isolate the well regions of the semiconductor substrate under different memory stacks. In some implementations, third isolation structure 120 may be formed by a conductive structure surrounded by dielectric layer and may electrically isolate the well regions of the semiconductor substrate under different memory stacks. By forming second isolation structure 120, the well regions of substrate 118 under different memory stacks can be electrically isolated without a complicated structure.

Figure 6:
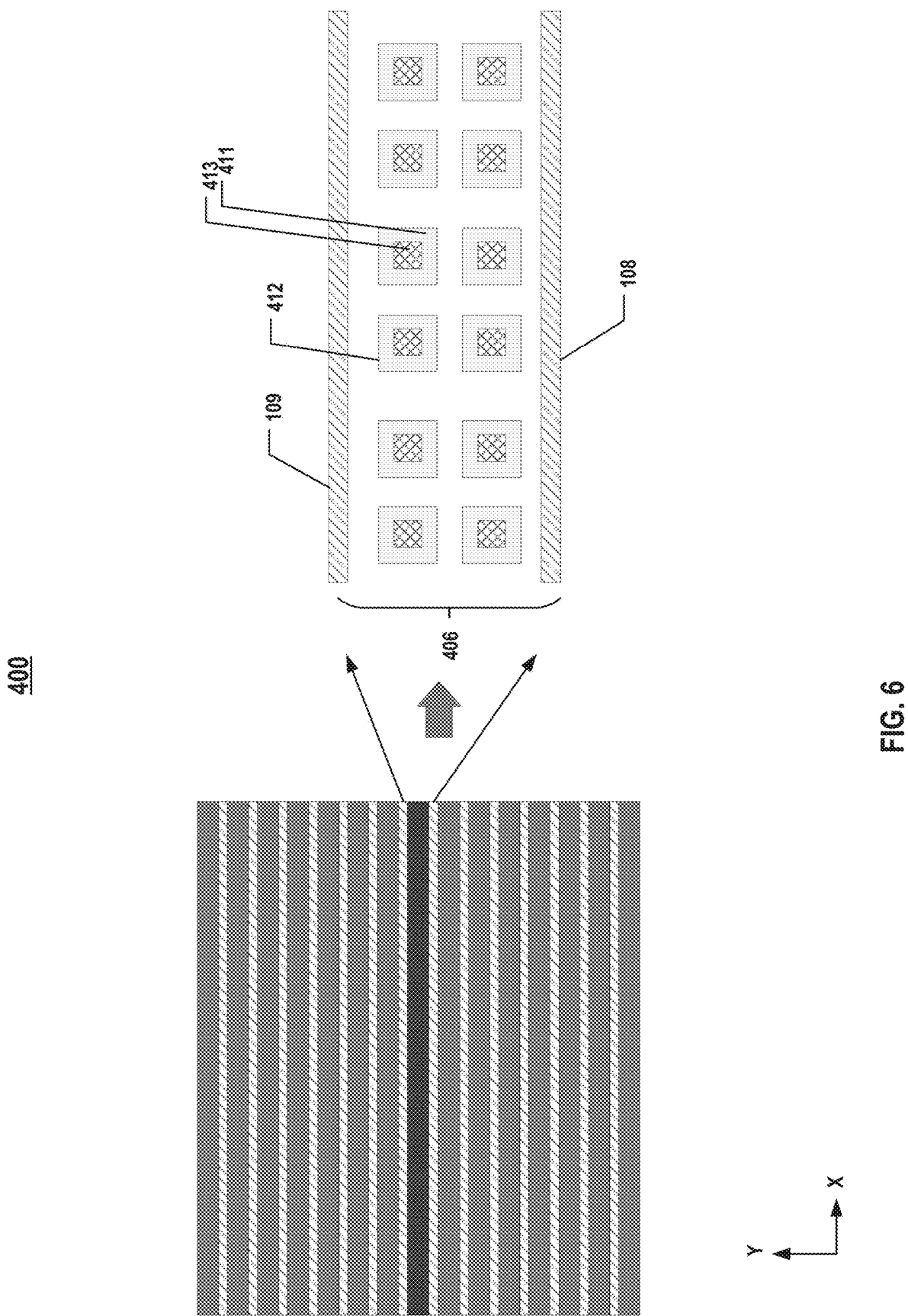
FIG. 6 illustrates a plan view of another exemplary 3D memory device, according to some aspects of the present disclosure.

FIG. 5 illustrates a cross-section of yet another exemplary 3D memory device 400, according to some aspects of the present disclosure. FIG. 6 illustrates a plan view of 3D memory device 400, according to some aspects of the present disclosure. For the purpose of better describing the present disclosure, the cross-section and the plan view of 3D memory device 400 in FIG. 5 and FIG. 6 will be discussed together.

3D memory device 400 is divided into first memory region 102, second memory region 104, and a dummy region 406. First isolation structure 108 is disposed between first memory region 102 and dummy region 406, and second isolation structure 109 is disposed between second memory region 104 and dummy region 406. First isolation structure 108 and second isolation structure 109 may extend along the z-direction and the x-direction. Channel structures 110 may be formed in first memory region 102 and second memory region 104. Channel structures 110 may extend along the z-direction perpendicular to the x-direction and the y-direction.

First memory region 102, dummy region 406, and second memory region 104 are arranged along the y-direction on substrate 118. In some implementations, substrate 118 may include silicon (e.g., single crystalline silicon), SiGe, GaAs, Ge, SOI, GOI, or any other suitable materials. In some implementations, substrate 118 may be a thinned substrate (e.g., a semiconductor layer), which was thinned by grinding, wet/dry etching, CMP, or any combination thereof.

First isolation structure 108 is formed between first memory region 102 and dummy region 406, and second isolation structure 109 is formed between second memory region 104 and dummy region 406. Each of first memory region 102 and second memory region 104 may include first conductive layers 114 (such as the word lines) and dielectric layers 116 alternately stacked along the z-direction. In some implementations, dummy region 406 may include a plurality of conductive layers and a plurality of dielectric layers alternately stacked along the z-direction. In some implementations, the plurality of conductive layers and the plurality of dielectric layers formed in dummy region 406 may be formed in the same processes with first conductive layers 114 and first dielectric layers 116 in first memory region 102 and second memory region 104. In other words, even though the conductive layers and the dielectric layers are divided in first memory region 102, second memory region 104, and dummy region 406, the conductive layers and the dielectric layers may be formed together during the manufacturing process. In some implementations, the structures and materials of first conductive layers 114, first dielectric layers 116, channel structures 110, first isolation structure 108, and second isolation structure 120 of 3D memory device 400 may be similar to those of 3D memory device 100.

3D memory device 400 further includes contact structures 412 formed in dummy region 406. In some implementations, each contact structure 412 may include a first conductive contact 413 extending along the z-direction through conductive layers 114 and dielectric layers 116. In some implementations, first conductive contact 413 may include W, Co, Cu, Al, polysilicon, silicides, or other suitable materials. Contact structures 412 may further include a spacer 411 disposed laterally between first conductive contact 413 and first conductive layers 114 and first dielectric layers 116 to electrically insulate first conductive contact 413 from surrounding first conductive layers 114 (the gate conductors in the memory stacks).

3D memory device 400 further includes a second conductive contact 420 formed under contact structures 412. In some implementations, first conductive contact 413 is in direct contact with second conductive contact 420. In some implementations, second conductive contact 420 may include W, Co, Cu, Al, polysilicon, silicides, or other suitable materials. By forming contact structures 412 in dummy block region 406, dummy block region 406 may not only be used for electrically isolating first memory region 102 and second memory region 104 but also be used to provide conductive paths through the memory stacks and the silicon substrate. In some implementations, the conductive paths formed by contact structures 412 and second conductive contact 420 may be used to connect the peripheral device and 3D memory device 400. For example, the source terminals of 3D memory device 400 may be connected to the peripheral device through the conductive paths formed by contact structures 412 and second conductive contact 420, and therefore the peripheral device may control the operations of 3D memory device 400. In some implementations, the conductive paths formed by contact structures 412 and second conductive contact 420 may be used to connected other devices disposed above, below, or aside 3D memory device 400. In some implementations, the peripheral device may include one or more peripheral circuits. In some implementations, the peripheral circuits may be electrically connected to 3D memory device 400 through the conductive wires, such as the redistribution layers.

Figure 7:
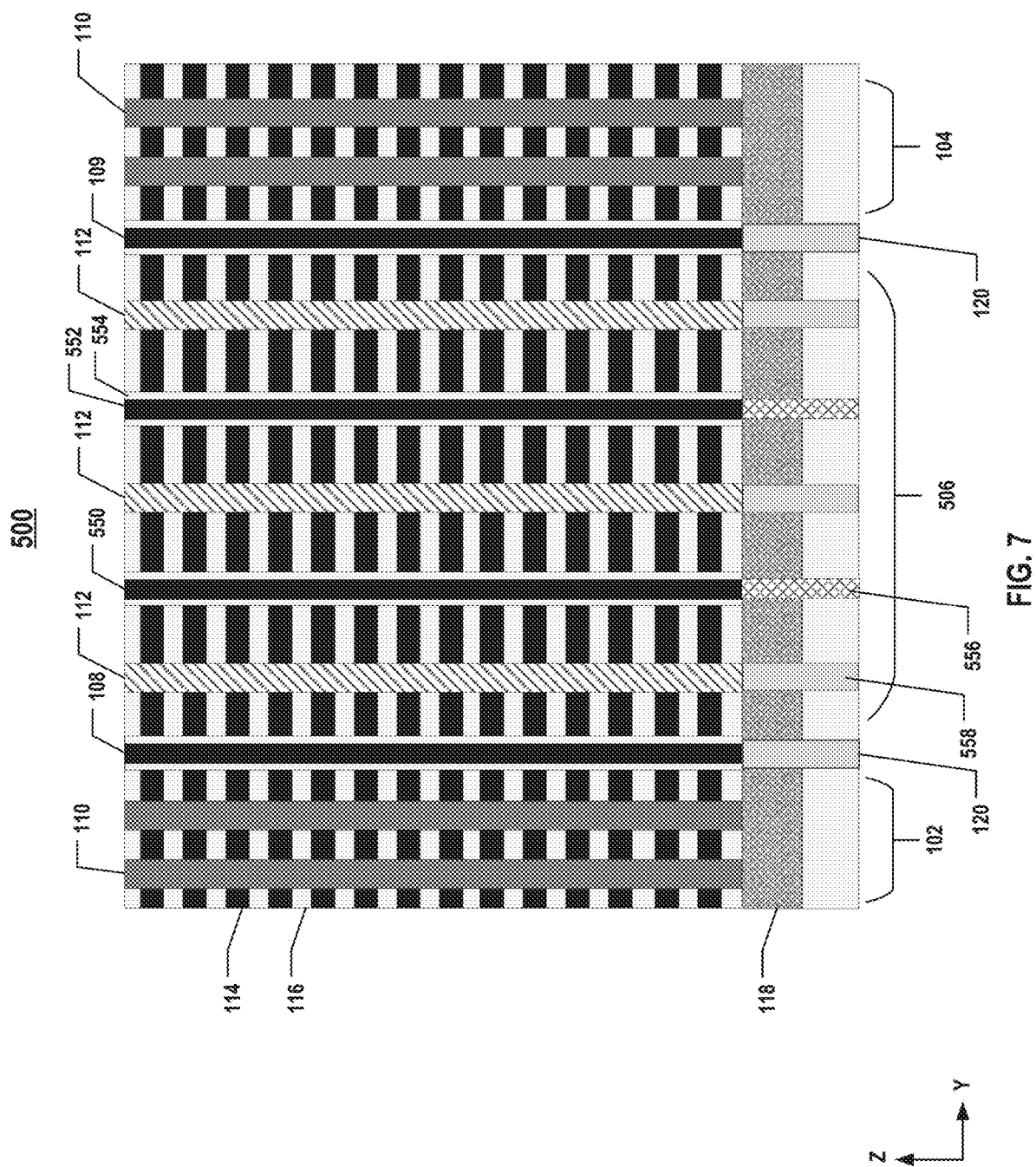
FIG. 7 illustrates a cross-section of yet another exemplary 3D memory device, according to some aspects of the present disclosure.
Figure 8:
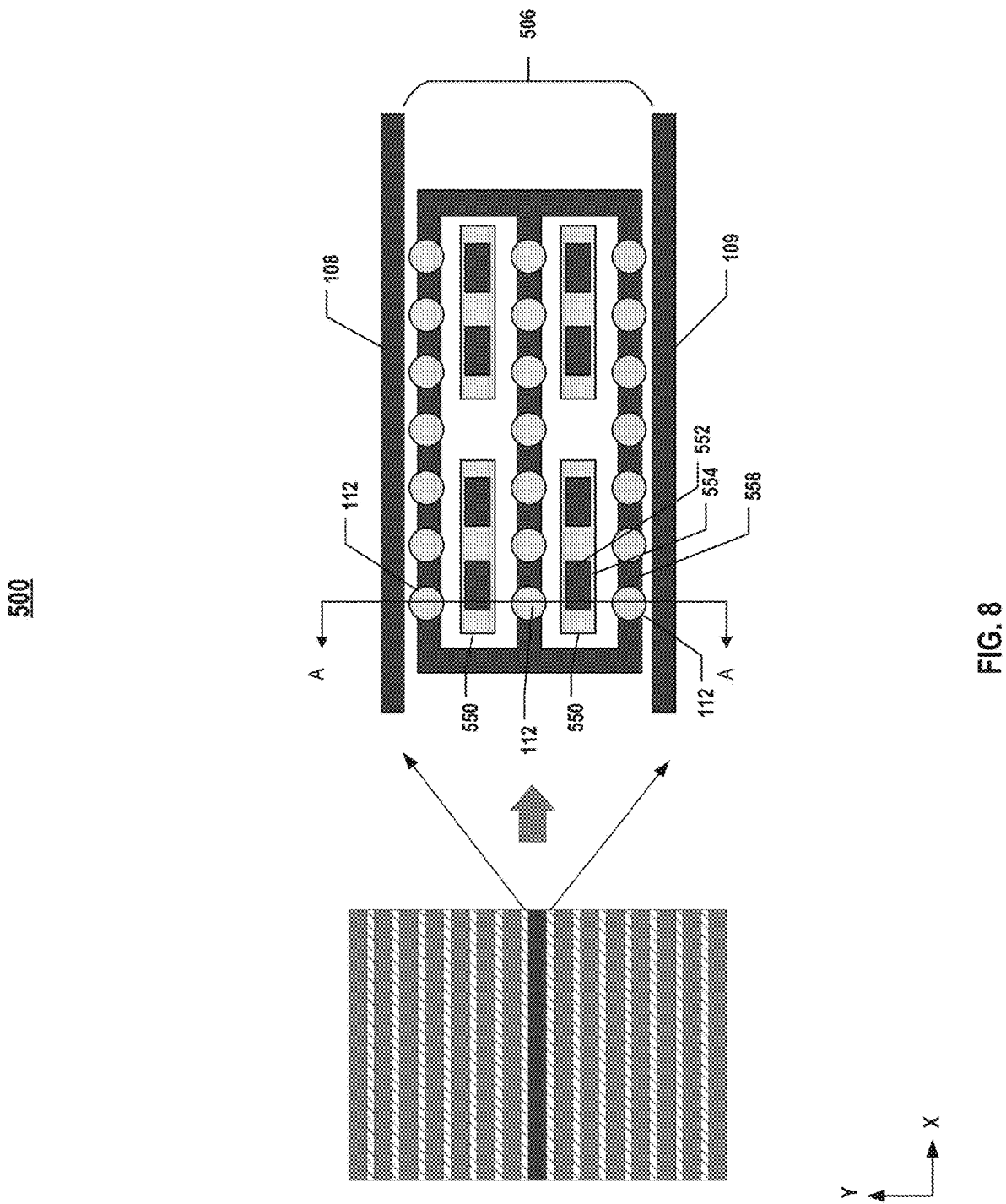
FIG. 8 illustrates a plan view of yet another exemplary 3D memory device, according to some aspects of the present disclosure.

FIG. 7 illustrates a cross-section along line A in FIG. 8 of yet another exemplary 3D memory device 500, according to some aspects of the present disclosure. FIG. 8 illustrates a plan view of 3D memory device 500, according to some aspects of the present disclosure. For the purpose of better describing the present disclosure, the cross-section and the plan view of 3D memory device 500 in FIG. 7 and FIG. 8 will be discussed together.

3D memory device 500 is divided into first memory region 102, second memory region 104, and a dummy region 506. First isolation structure 108 is disposed between first memory region 102 and dummy region 506, and second isolation structure 109 is disposed between second memory region 104 and dummy region 506. In addition, one or more than one fifth isolation structure 550 is also disposed in dummy region 506, as shown in FIG. 7. First isolation structure 108, second isolation structure 109, and fifth isolation structure 550 may extend along the x-direction and the z-direction. Channel structures 110 may be formed in first memory region 102 and second memory region 104. Channel structures 110 may extend along the z-direction perpendicular to the x-direction and the y-direction. Dummy channel structures 112 may be formed in dummy region 506. Similarly, dummy channel structures 112 may extend along the z-direction perpendicular to the x-direction and the y-direction.

First memory region 102, dummy region 506, and second memory region 104 are arranged along the y-direction on substrate 118. Each of first memory region 102, dummy region 506, and second memory region 104 may include first conductive layers 114 (such as the word lines) and dielectric layers 116 alternately stacked along the z-direction. In some implementations, the structures and materials of first conductive layers 114, first dielectric layers 116, channel structures 110, first isolation structure 108, second isolation structure 109, and third isolation structure 120 of 3D memory device 500 may be similar to those of 3D memory device 100.

3D memory device 500 further includes a sixth isolation structure 558 disposed under dummy channel structures 112. In some implementations, sixth isolation structure 558 may be formed in substrate 118 extending along the z-direction. In some implementations, the structure and material of sixth isolation structure 558 may be similar to those of third isolation structure 120. 3D memory device 500 further includes a conductive contact 556 disposed under fifth isolation structure 550 in dummy block region 506. In some implementations, conductive contact 556 is surrounded by a dielectric layer.

In some implementations, fifth isolation structure 550 may include a gate line slit structure. The gate line slit structure may extend vertically along the z-direction through the memory stacks, as shown in FIG. 7, and may also extend laterally along the x-direction, as shown in FIG. 8. In some implementations, the gate line slit structure may include a slit contact 552, formed by filling the slit opening with conductive materials including but not limited to W, Co, Cu, Al, polysilicon, silicides, or any combination thereof. The gate line slit structure may further include a composite spacer 554 disposed laterally between the slit contact and first conductive layers 114 and first dielectric layers 116 to electrically insulate the gate line slit structure from surrounding first conductive layers 114 (the gate conductors in the memory stacks). As a result, the gate line slit structure electrically separates the memory stacks in first memory region 102, dummy region 506, and second memory region 104.

By forming conductive contact 556 in dummy block region 506 in direct contact with fifth isolation structure 550, slit contact 552 is in direct contact with conductive contact 556. Hence, in dummy block region 506, fifth isolation structure 550 and conductive contact 556 may provide conductive paths through the memory stacks and the silicon substrate.

Figure 10:
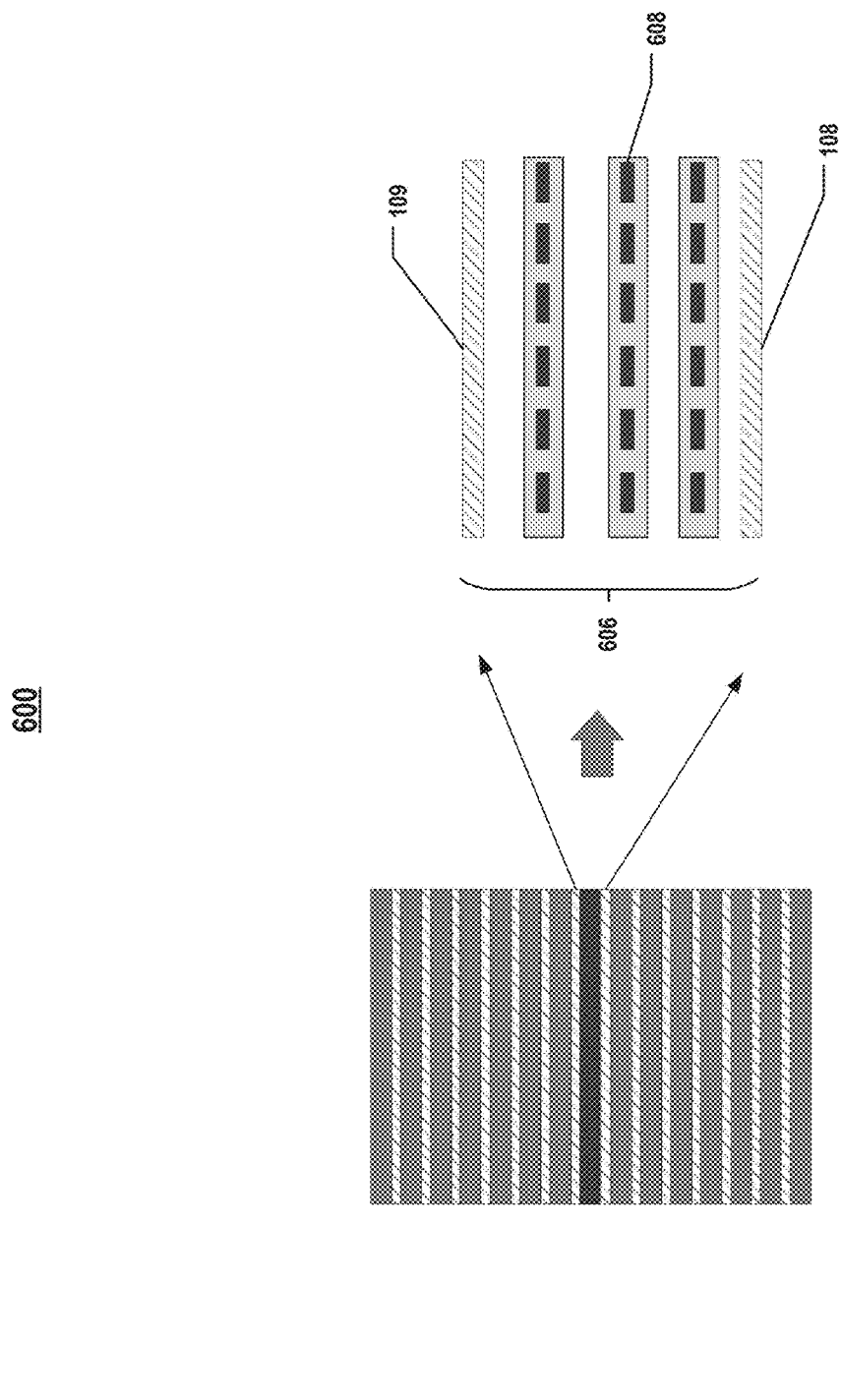
FIG. 10 illustrates a plan view of yet another exemplary 3D memory device, according to some aspects of the present disclosure.

FIG. 9 illustrates a cross-section of yet another exemplary 3D memory device 600, according to some aspects of the present disclosure. FIG. 10 illustrates a plan view of 3D memory device 600, according to some aspects of the present disclosure. For the purpose of better describing the present disclosure, the cross-section and the plan view of 3D memory device 600 in FIG. 9 and FIG. 10 will be discussed together.

3D memory device 600 is divided into first memory region 102, second memory region 104, and a dummy region 606. First isolation structure 108 is disposed between first memory region 102 and dummy region 606, and second isolation structure 109 is disposed between second memory region 104 and dummy region 606. In some implementations, first isolation structure 108 and second isolation structure 109 may extend vertically along the z-direction between first memory region 102 and dummy region 606, and between second memory region 104 and dummy region 606. In some implementations, first isolation structure 108 and second isolation structure 109 may include a barrier structure formed by dielectric materials. The barrier structure may extend vertically along the z-direction through the memory stacks and may also extend laterally along the x-direction to separate the memory stacks into multiple blocks. In some implementations, the barrier structure may include one or multiple dielectric layers to electrically separates the memory stacks in first memory region 102, dummy region 606, and second memory region 104.

In some implementations, the structures and materials of first conductive layers 114, first dielectric layers 116, channel structures 110, and third isolation structure 120 of 3D memory device 600 may be similar to those of 3D memory device 100. 3D memory device 600 further includes a seventh isolation structure 608 disposed in dummy region 606 extending vertically along the z-direction, and a conductive contact 620 disposed under seventh isolation structure 608 in dummy region 506.

In some implementations, seventh isolation structure 608 may include a gate line slit structure. The gate line slit structure may extend vertically along the z-direction through the memory stacks and may also extend laterally along the x-direction. In some implementations, the gate line slit structure may include a slit contact, formed by filling the slit opening with conductive materials including but not limited to, W, Co, Cu, Al, polysilicon, silicides, or any combination thereof. The gate line slit structure may further include a composite spacer disposed laterally between the slit contact and first conductive layers 114 and first dielectric layers 116 to electrically insulate the gate line slit structure from surrounding first conductive layers 114.

Conductive contact 620 may be formed in substrate 118 under third isolation structure 608. In some implementations, conductive contact 620 may be in direct contact with the slit contact of seventh isolation structure 608. In some implementations, conductive contact 602 is surrounded by a dielectric layer. By forming conductive contact 620 in dummy region 606 in direct contact with seventh isolation structure 608, the slit contact is in direct contact with conductive contact 620. Hence, in dummy region 606, seventh isolation structure 608 and conductive contact 620 may provide conductive paths through the memory stacks and the silicon substrate.

Figure 15:
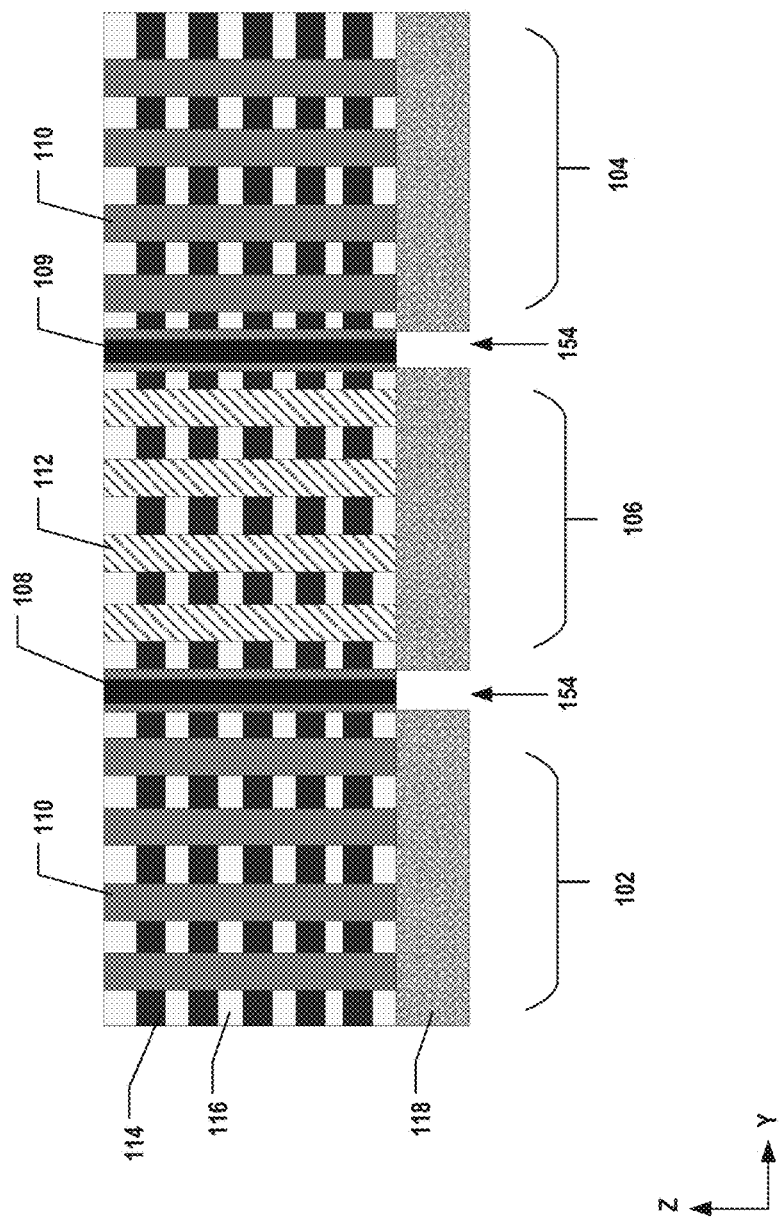
Figure 16:
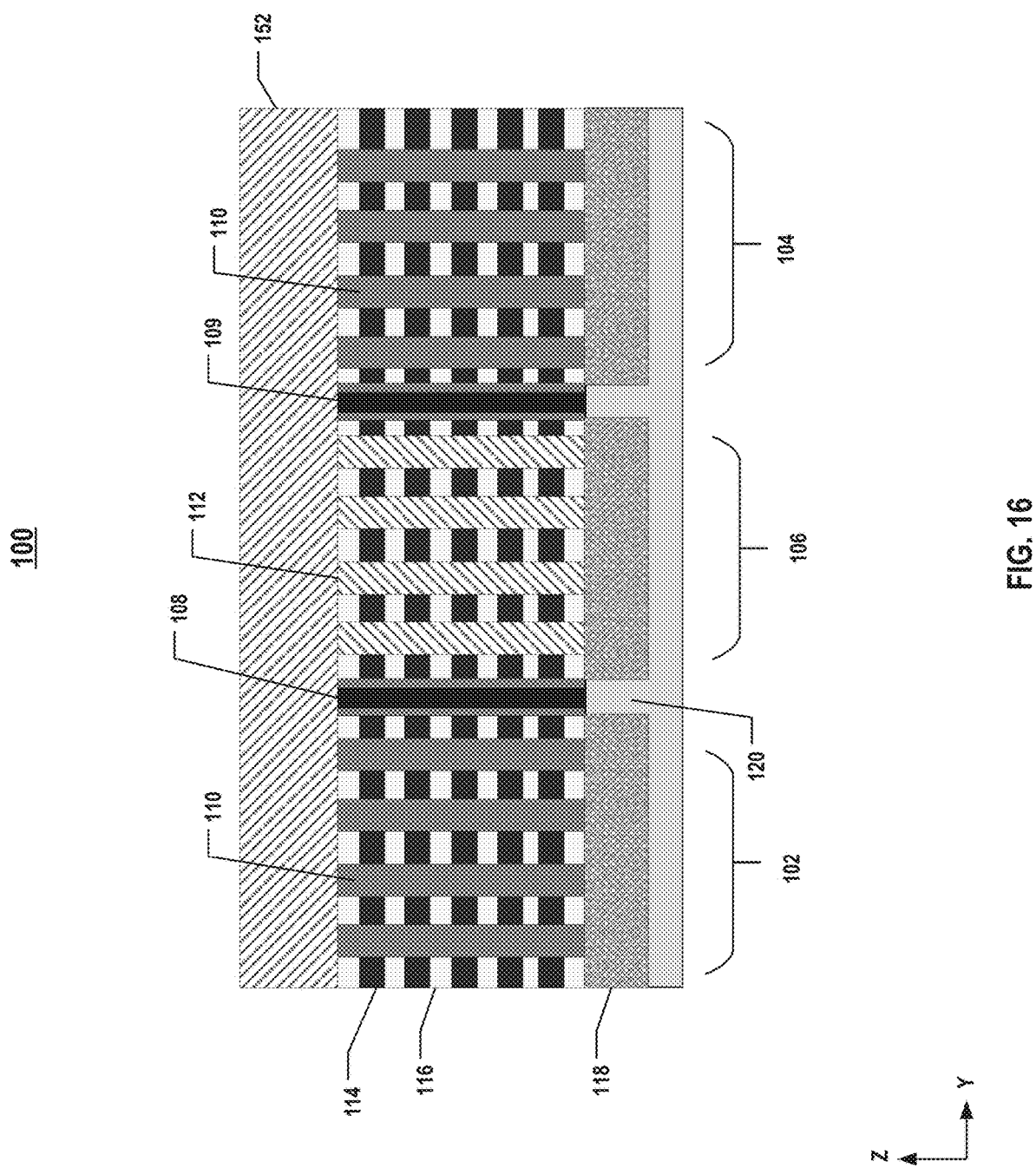
Figure 17:
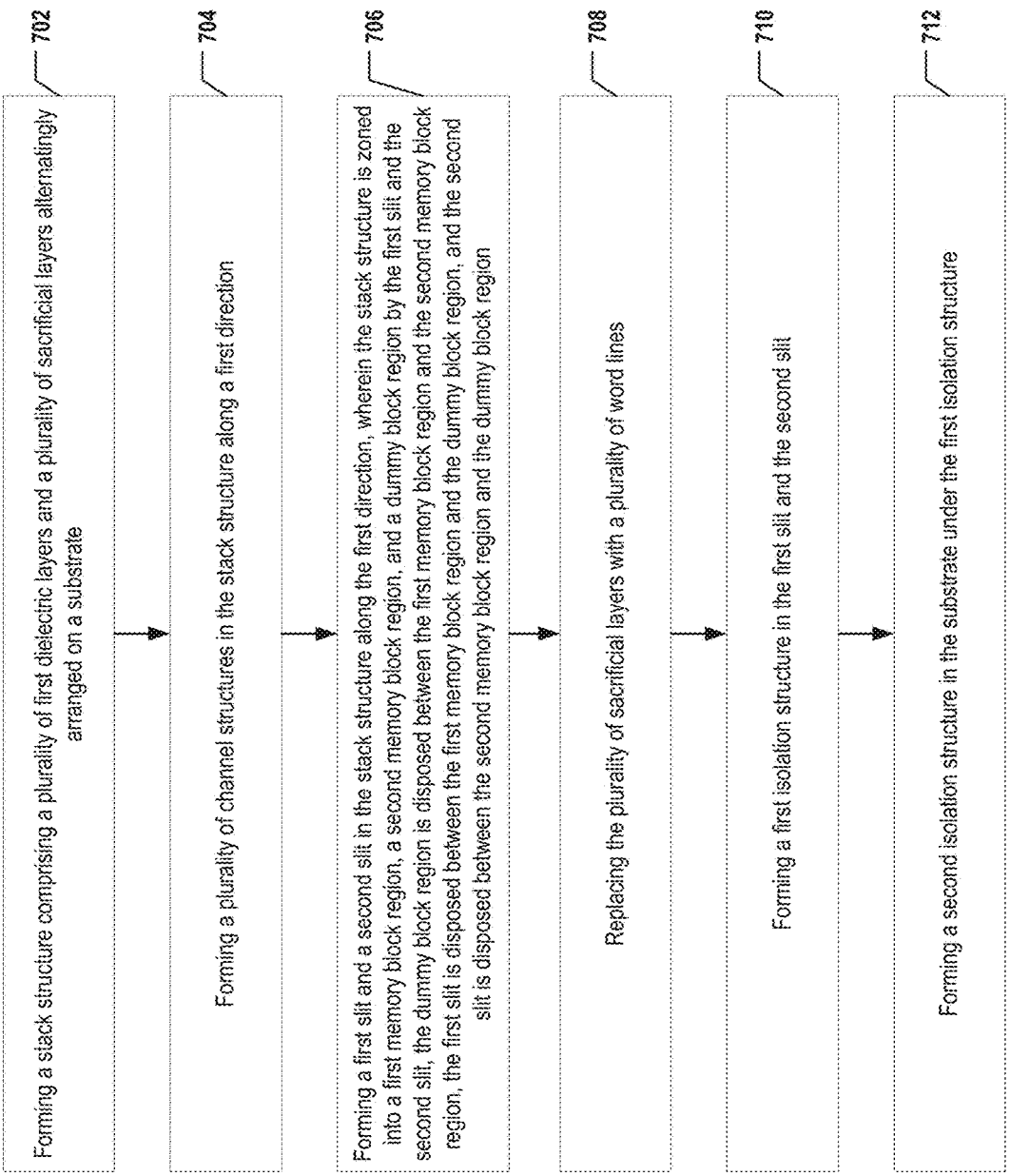
FIG. 17 illustrates a flowchart of an exemplary method for forming a 3D memory device, according to some aspects of the present disclosure.

FIGS. 11-16 illustrate cross-sections of 3D memory device 100 at different stages of a manufacturing process, according to some aspects of the present disclosure. FIG. 17 illustrates a flowchart of an exemplary method 700 for forming 3D memory device 100, according to some aspects of the present disclosure. For the purpose of better describing the present disclosure, the cross-sections of 3D memory device 100 in FIGS. 11-16 and method 700 in FIG. 17 will be discussed together. It is understood that the operations shown in method 700 are not exhaustive and that other operations may be performed as well before, after, or between any of the illustrated operations. Further, some of the operations may be performed simultaneously, or in a different order than shown in FIGS. 11-16 and FIG. 17.

Figure 11:
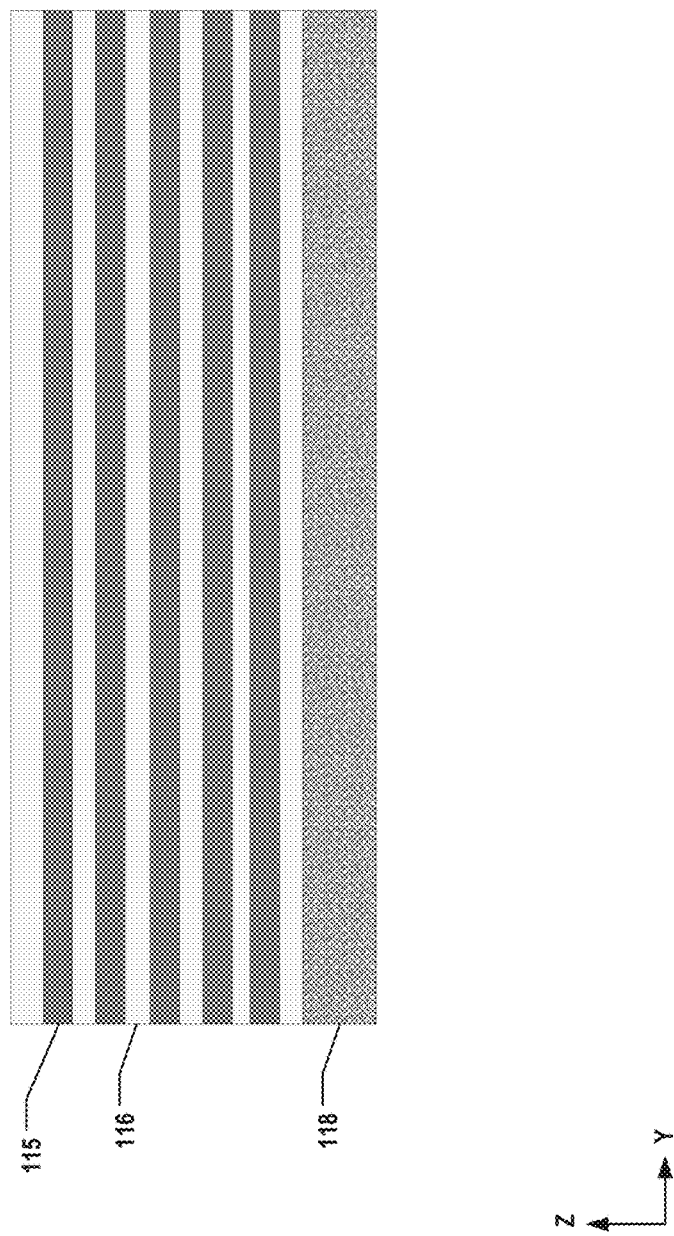
FIGS. 11-16 illustrate cross-sections of an exemplary 3D memory device at different stages of a manufacturing process, according to some aspects of the present disclosure.

As shown in FIG. 11 and operation 702 in FIG. 17, a stack structure including a plurality of first dielectric layers 116 and a plurality of sacrificial layers 115 is formed on substrate 118. First dielectric layers 116 and sacrificial layers 115 are alternatingly arranged on substrate 118. The dielectric/sacrificial layer pairs may extend along the y-direction. In some implementations, each first dielectric layer 116 may include a layer of silicon oxide, and each sacrificial layer 115 may include a layer of silicon nitride. First dielectric layers 116 and sacrificial layers 115 may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between the substrate and the stack structure by depositing dielectric materials, such as silicon oxide, on the substrate.

Figure 12:
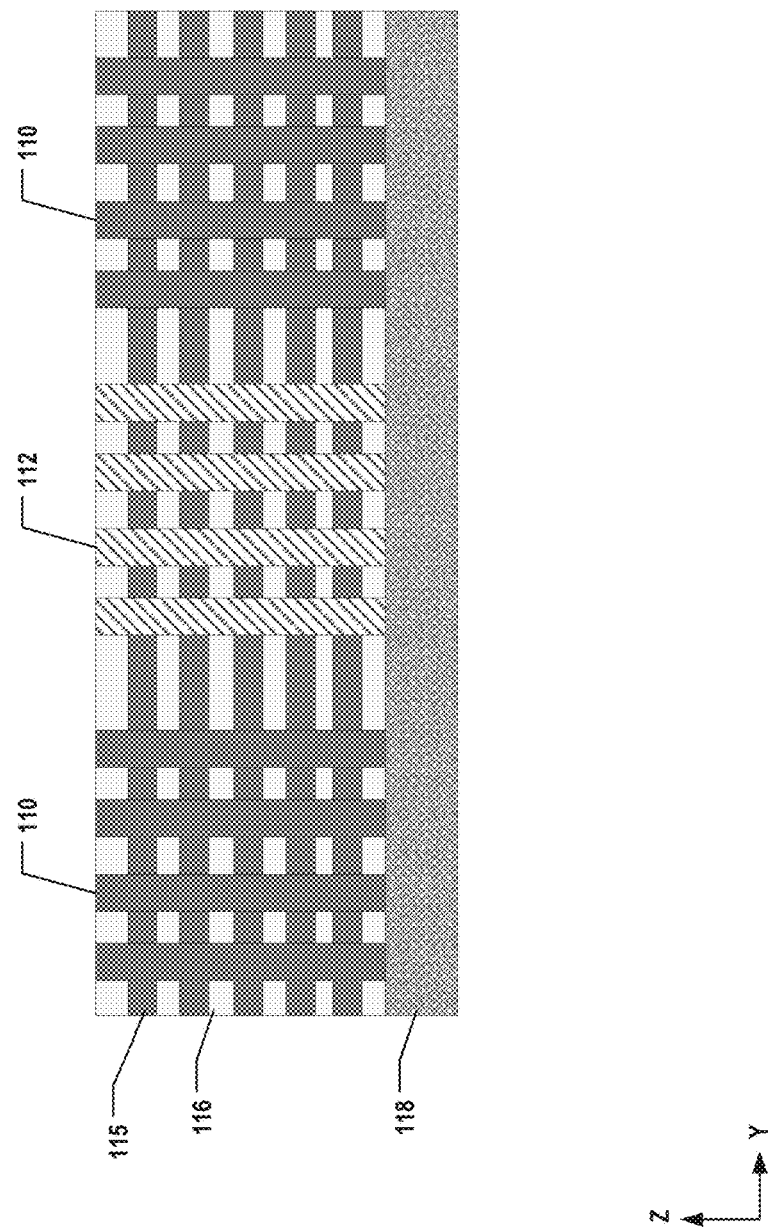

As shown in FIG. 12 and operation 704 in FIG. 17, channel structures 110 and dummy channel structures 112 are formed in the stack structure along the z-direction. In some implementations, channel structures 110 and dummy channel structures 112 may have the same structure.

Each channel structure 110 or dummy channel structure 112 may include a semiconductor channel and a memory film formed over the semiconductor channel. In some implementations, a channel hole is formed in the stack structure along the z-direction. In some implementations, an etch process may be performed to form the channel hole in the stack structure that extends vertically (z-direction) through the interleaved dielectric/sacrificial layers. In some implementations, fabrication processes for forming the channel hole may include wet etching and/or dry etching, such as deep reactive ion etching (DRIE). In some implementations, the channel hole may extend further into the top portion of substrate 118. Then, a blocking layer, a storage layer, a tunneling layer, and a semiconductor channel may be sequentially formed in the channel hole.

Figure 13:
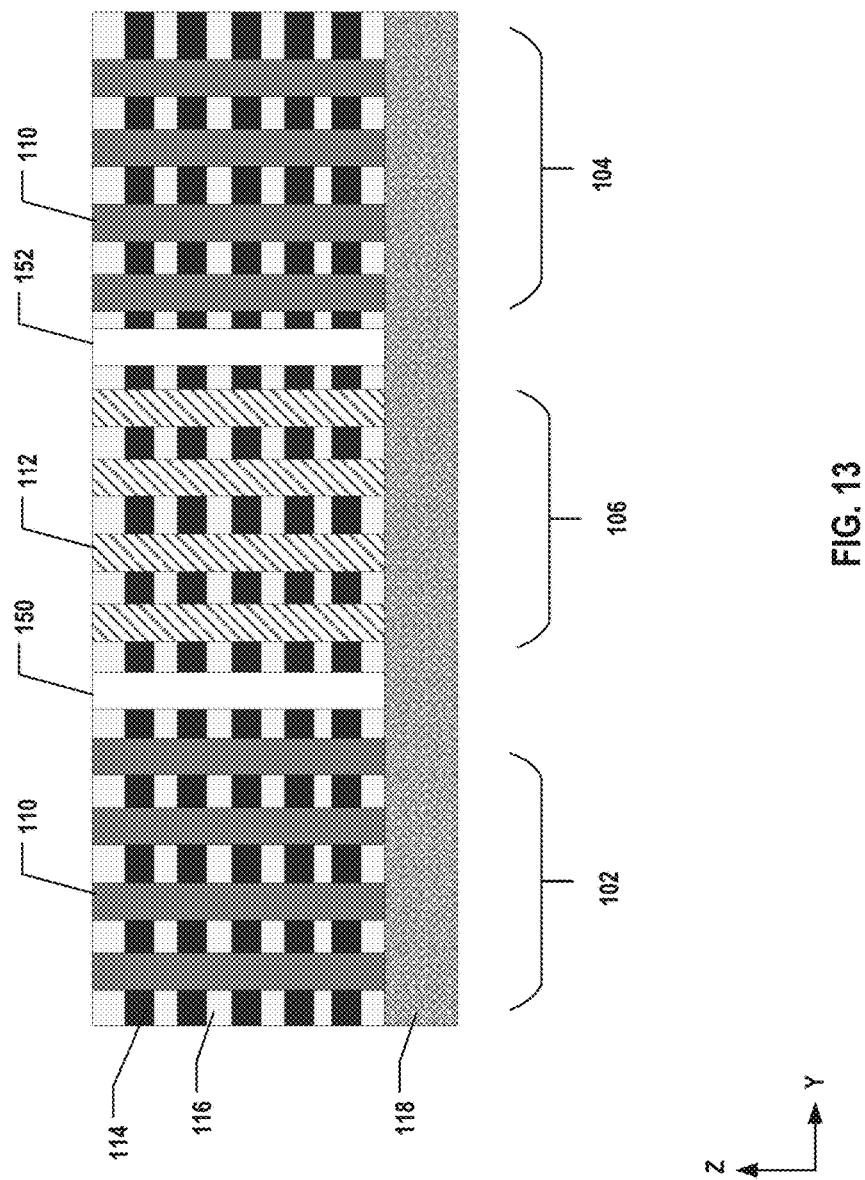

As shown in FIG. 13 and operation 706 in FIG. 17, a first slit 150 and a second slit 152 are formed in the stack structure along the y-direction. The stack structure is zoned into first memory region 102, second memory region 104, and dummy region 106 by first slit 150 and second slit 152. Dummy region 106 is disposed between first memory region 102 and second memory region 104. First slit 150 is disposed between first memory region 102 and dummy region 106, and second slit 152 is disposed between second memory region 104 and dummy region 106. In some implementations, first slit 150 and second slit 152 may be formed by dry etch, wet etch, or other suitable processes.

Figure 14:
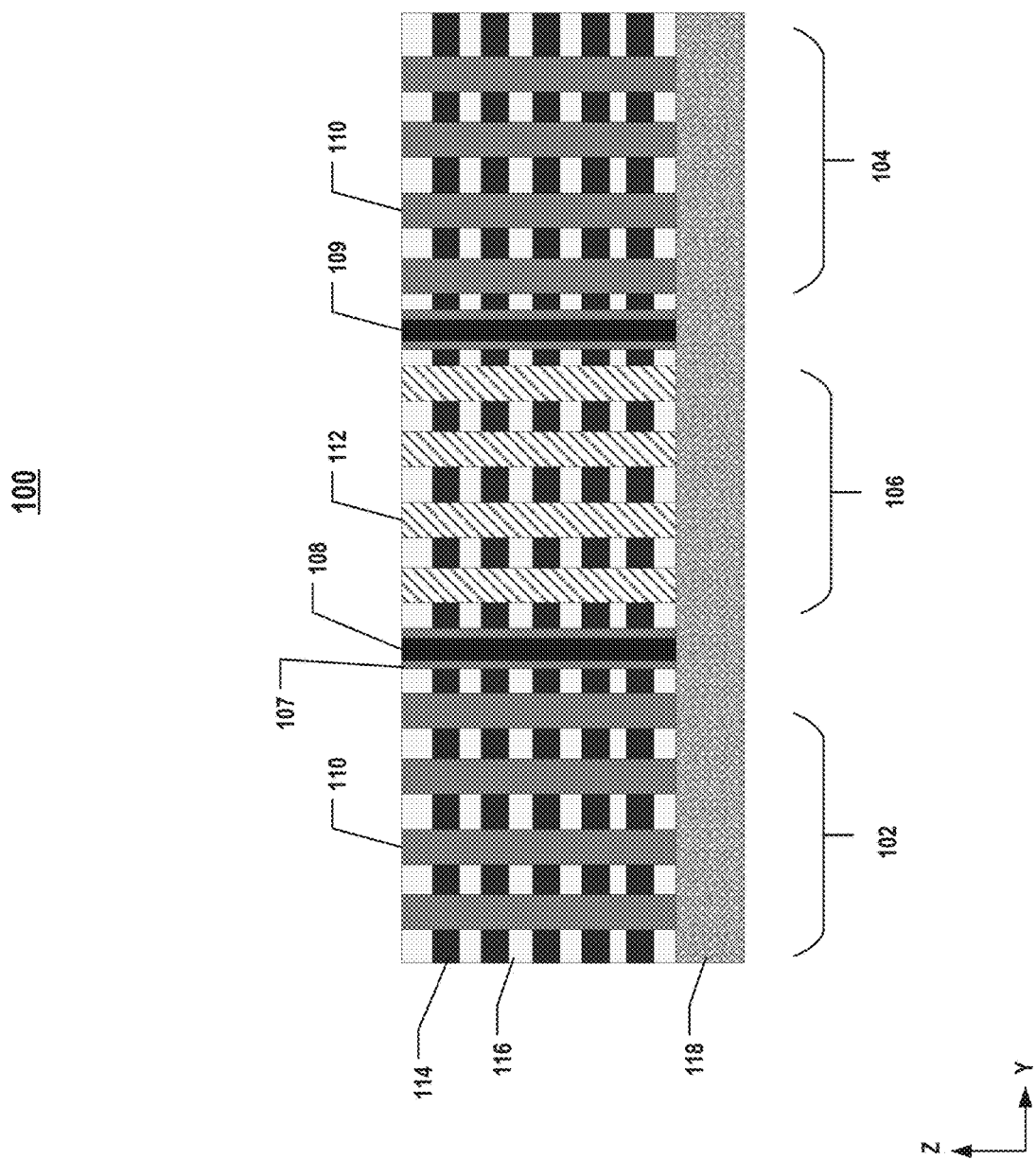

As shown in FIG. 14 and operation 708 in FIG. 17, the plurality of sacrificial layers 115 are replaced with the plurality of word lines (first conductive layers 114). For example, sacrificial layers 115 may be removed by dry etch, wet etch, or other suitable processes to form a plurality of cavities. The word lines (first conductive layers 114) may be formed in the cavities by depositing the gate conductor, and the gate conductor made from tungsten. In some implementations, the cavities may be filled with the gate dielectric layer made from high-k dielectric materials, the adhesion layer including titanium/titanium nitride (Ti/TiN) or tantalum/tantalum nitride (Ta/TaN).

Then, as shown in FIG. 14 and operation 710 in FIG. 17, first isolation structure 108 and second isolation structure 109 may be formed in first slit 150 and second slit 152. It is understood that first isolation structure 108 and second isolation structure 109 in FIG. 14 may be like or the same as first isolation structure 108 and second isolation structure 109 described above. In some implementations, a spacer 107 is formed along a sidewall of first slit 150 and second slit 152. In some implementations, spacer 107 may include one or multiple layers of dielectric films. Then, a slit contact is formed by filling (e.g., depositing) conductive materials into the remaining space of first slit 150 and second slit 152 by PVD, CVD, ALD, any other suitable process, or any combination thereof. The slit contact may serve as a common source contact, according to some implementations. In some implementations, the slit contact may include conductive materials including, not limited to, W, Co, Cu, Al, polysilicon, silicides, or any combination thereof.

As shown in FIG. 15, a portion of substrate 118 is removed to form an opening 154. In some implementations, the portion of substrate 118 may be removed by dry etch, wet etch, or other suitable processes. In some implementations, a thinning operation may be further performed to thin substrate 118 and a carrier wafer 152 may be used during the thinning operation. As shown in FIG. 16 and operation 712 in FIG. 17, third isolation structure 120 is formed in opening 154 under first isolation structure 108 and second isolation structure 109. In some implementations, third isolation structure 120 may be formed by dielectric material, and the dielectric material may also cover substrate 118.

Figure 18:
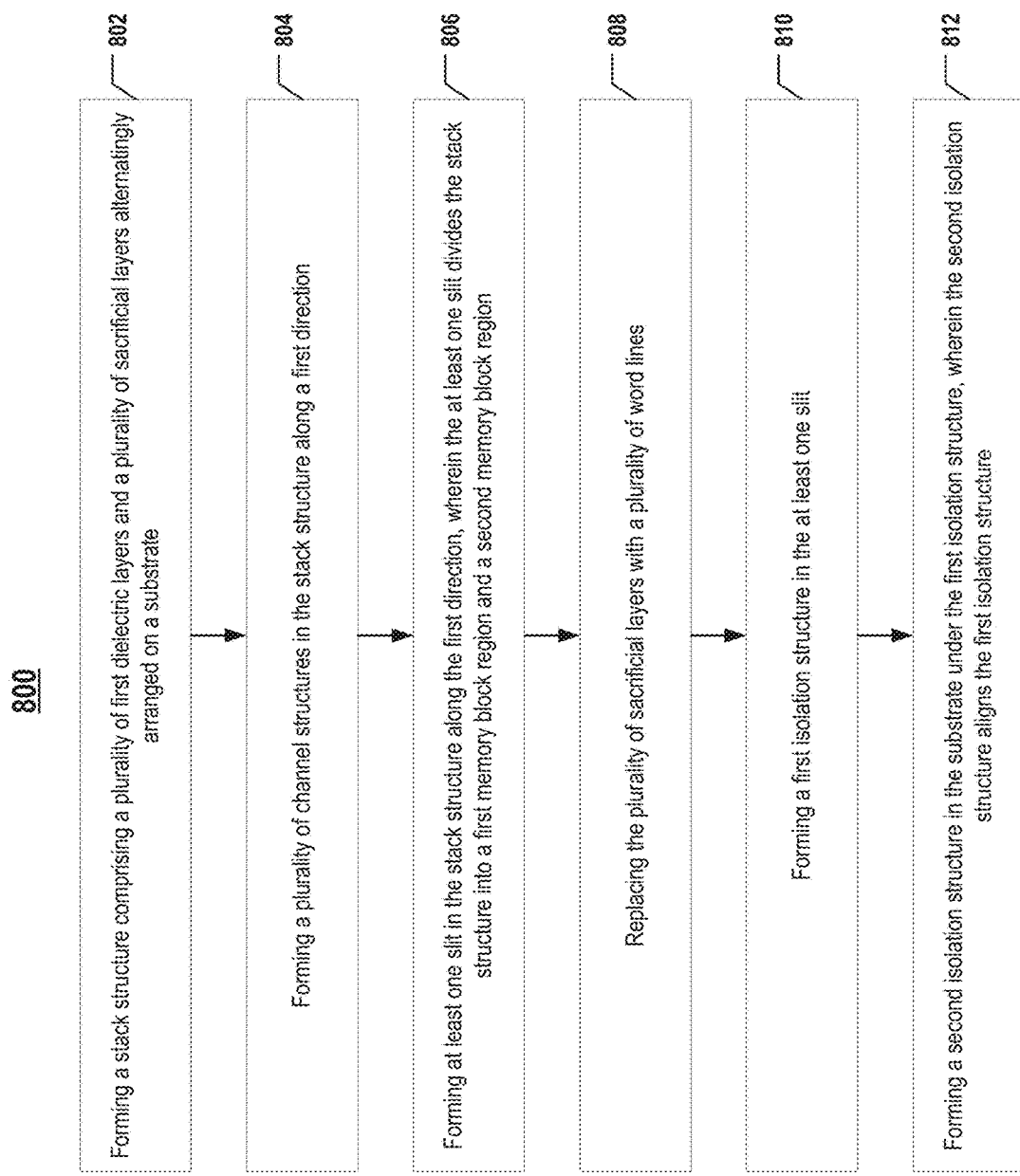
FIG. 18 illustrates a flowchart of another exemplary method for forming a 3D memory device, according to some aspects of the present disclosure.

FIG. 18 illustrates a flowchart of another exemplary method 800 for forming 3D memory device 300, according to some aspects of the present disclosure. As shown in operation 802 in FIG. 18, a stack structure including a plurality of first dielectric layers 116 and a plurality of sacrificial layers 115 is formed on substrate 118. First dielectric layers 116 and sacrificial layers 115 are alternatingly arranged on substrate 118. The dielectric/sacrificial layer pairs may extend along the x-direction. In some implementations, each first dielectric layer 116 may include a layer of silicon oxide, and each sacrificial layer 115 may include a layer of silicon nitride. First dielectric layers 116 and sacrificial layers 115 may be formed by one or more thin film deposition processes including, but not limited to, CVD, PVD, ALD, or any combination thereof. In some implementations, a pad oxide layer (not shown) is formed between the substrate and the stack structure by depositing dielectric materials, such as silicon oxide, on the substrate.

As shown in operation 804 in FIG. 18, channel structures 110 are formed in the stack structure along the y-direction. Each channel structure 110 may include a semiconductor channel and a memory film formed over the semiconductor channel. In some implementations, a channel hole is formed in the stack structure along the y-direction. In some implementations, an etch process may be performed to form the channel hole in the stack structure that extends vertically (y-direction) through the interleaved dielectric/sacrificial layers. In some implementations, fabrication processes for forming the channel hole may include wet etching and/or dry etching, such as DRIE. In some implementations, the channel hole may extend further into the top portion of substrate 118. Then, a blocking layer, a storage layer, a tunneling layer, and a semiconductor channel may be sequentially formed in the channel hole.

As shown in operation 806 in FIG. 18, a slit may be formed in the stack structure along the y-direction. The stack structure is zoned into first memory block region 102 and second memory block region 104 by the slit. In some implementations, the slit may be formed by dry etch, wet etch, or other suitable processes.

As shown in operation 808 in FIG. 18, the plurality of sacrificial layers 115 are replaced with the plurality of word lines (first conductive layers 114). For example, sacrificial layers 115 may be removed by dry etch, wet etch, or other suitable processes to form a plurality of cavities. The word lines (first conductive layers 114) may be formed in the cavities by depositing the gate conductor, and the gate conductor made from tungsten. In some implementations, the cavities may be filled with the gate dielectric layer made from high-k dielectric materials, the adhesion layer including Ti/TiN or Ta/TaN.

As shown in operation 810 in FIG. 18, first isolation structure 108 may be formed in the slit. In some implementations, a spacer is formed along a sidewall of the slit. In some implementations, the spacer may include one or multiple layers of dielectric films. Then, a slit contact is formed by filling (e.g., depositing) conductive materials into the remaining space of the slit by PVD, CVD, ALD, any other suitable process, or any combination thereof. The slit contact may serve as a common source contact, according to some implementations. In some implementations, the slit contact may include conductive materials including, not limited to, W, Co, Cu, Al, polysilicon, silicides, or any combination thereof.

As shown in operation 812 in FIG. 18, a portion of substrate 118 is removed to form an opening 154, and second isolation structure 120 is formed in opening 154 under first isolation structure 108. In some implementations, second isolation structure 120 may be formed by dielectric material, and the dielectric material may also cover substrate 118.

By forming first isolation structure 108 and second isolation structure 120 between first memory block region 102 and second memory block region 104, the word line (first conductive layers 114) of different memory stacks may be isolated, and the well regions of substrate 118 under different memory stacks can also be electrically isolated without a complicated structure.

Figure 19:
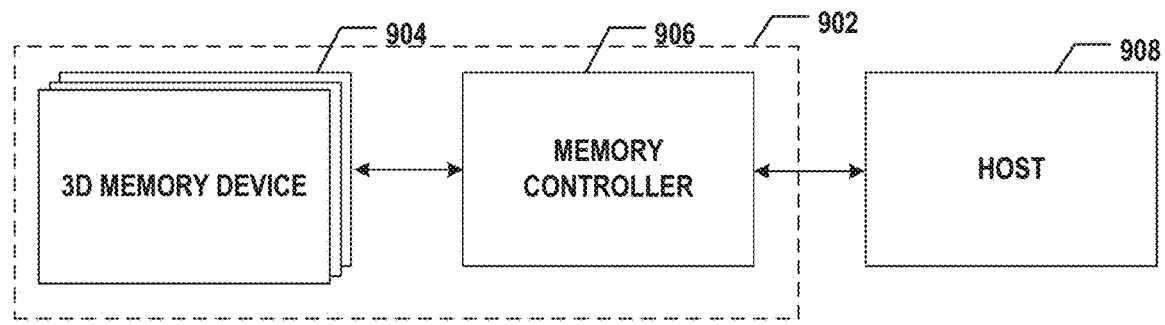
FIG. 19 illustrates a block diagram of an exemplary system having a memory device, according to some aspects of the present disclosure.

FIG. 19 illustrates a block diagram of an exemplary system 900 having a memory device, according to some aspects of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 19, system 900 can include a host 908 and a memory system 902 having one or more memory devices 904 and a memory controller 906. Host 908 can be a processor of an electronic device, such as a central processing unit (CPU), or a system-on-chip (SoC), such as an application processor (AP). Host 908 can be configured to send or receive data to or from memory devices 904.

Memory device 904 can be any memory device disclosed in the present disclosure. As disclosed above in detail, memory device 904, such as a NAND Flash memory device, may have a controlled and predefined discharge current in the discharge operation of discharging the bit lines. Memory controller 906 is coupled to memory device 904 and host 908 and is configured to control memory device 904, according to some implementations. Memory controller 906 can manage the data stored in memory device 904 and communicate with host 908. For example, memory controller 906 may be coupled to memory device 904, such as 3D memory device 100 described above, and memory controller 906 may be configured to control the operations of channel structure 110 through the peripheral device. By forming the structure according to the present disclosure, the area of 3D memory device 100 may be reduced by using the first isolation structures disclosed.

In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 906 can be configured to control operations of memory device 904, such as read, erase, and program operations. Memory controller 906 can also be configured to manage various functions with respect to the data stored or to be stored in memory device 904 including, but not limited to bad-block management, garbage collection, logical-to-physical address conversion, wear leveling, etc. In some implementations, memory controller 906 is further configured to process error correction codes (ECCs) with respect to the data read from or written to memory device 904. Any other suitable functions may be performed by memory controller 906 as well, for example, formatting memory device 904. Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 20A:
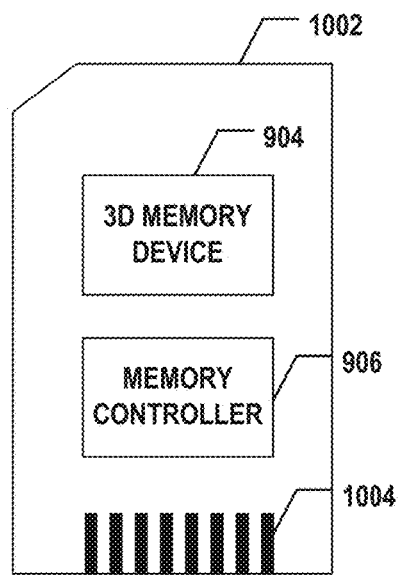
FIG. 20A illustrates a diagram of an exemplary memory card having a memory device, according to some aspects of the present disclosure.
Figure 20B:
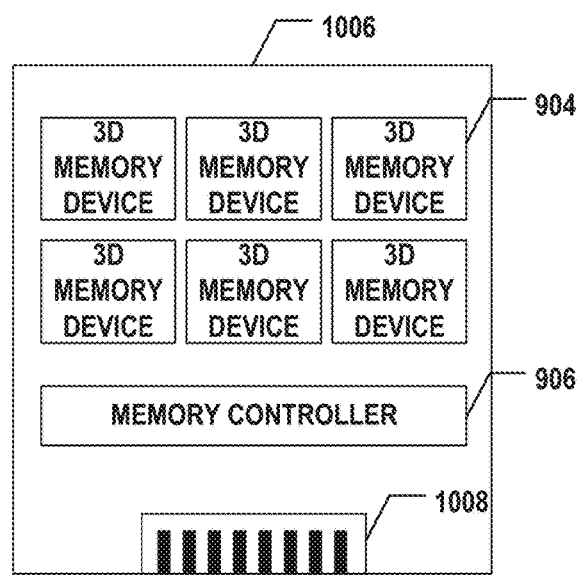
FIG. 20B illustrates a diagram of an exemplary solid-state drive (SSD) having a memory device, according to some aspects of the present disclosure.

Memory controller 906 and one or more memory devices 904 can be integrated into various types of storage devices, for example, be included in the same package, such as a universal Flash storage (UFS) package or an eMMC package. That is, memory system 902 can be implemented and packaged into different types of end electronic products. In one example as shown in FIG. 20A, memory controller 906 and a single memory device 904 may be integrated into a memory card 1002. Memory card 1002 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1002 can further include a memory card connector 1004 coupling memory card 1002 with a host (e.g., host 908 in FIG. 19). In another example as shown in FIG. 20B, memory controller 906 and multiple memory devices 904 may be integrated into an SSD 1006. SSD 1006 can further include an SSD connector 1008 coupling SSD 1006 with a host (e.g., host 908 in FIG. 19). In some implementations, the storage capacity and/or the operation speed of SSD 1006 is greater than those of memory card 1002.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
    a plurality of memory stacks comprising a first memory stack and a second memory stack arranged along a first direction, each memory stack comprising:
        a plurality of first conductive layers and a plurality of first dielectric layers alternately stacked along a second direction perpendicular to the first direction; and
        a channel structure extending through the plurality of first conductive layers and the plurality of first dielectric layers along the second direction;
    a dummy structure disposed between the first memory stack and the second memory stack, the dummy structure extending along a second direction perpendicular to the first direction and a third direction perpendicular to the first direction and the second direction;
    a first isolation structure disposed between the dummy structure and the first memory stack, the first isolation structure extending along the second direction and the third direction;
    a second isolation structure disposed between the dummy structure and the second memory stack, the second isolation structure extending along the second direction and the third direction;
    a semiconductor layer disposed under the plurality of memory stacks, the dummy structure, the first isolation structure, and the second isolation structure; and
    a trench isolation structure disposed in the semiconductor layer extending along the second direction and the third direction.

2. The 3D memory device of claim 1, wherein the dummy structure comprises a plurality of second conductive layers and a plurality of second dielectric layers alternately stacked along the second direction.

3. The 3D memory device of claim 2, wherein the plurality of first conductive layers and the plurality of second conductive layers comprise a same conductive material, and the plurality of first dielectric layers and the plurality of second dielectric layers comprise a same dielectric material.

4. The 3D memory device of claim 3, wherein the dummy structure further comprises a dummy channel structure extending through the plurality of second conductive layers and the plurality of second dielectric layers along the second direction, wherein the dummy channel structure comprises a semiconductor channel and a memory film formed over the semiconductor channel.

5. The 3D memory device of claim 3, wherein the dummy structure further comprises a contact structure extending through the plurality of second conductive layers and the plurality of second dielectric layers along the second direction.

6. The 3D memory device of claim 5, wherein the contact structure further comprises:
    a contact extending through the plurality of second conductive layers and the plurality of second dielectric layers along the second direction; and
    a third dielectric layer extending along the second direction surrounding the contact.

7. The 3D memory device of claim 6, further comprising:
    a third conductive layer disposed in the semiconductor layer extending along the second direction under the contact, wherein the third conductive layer is in electric contact with the contact and is surrounded by a third dielectric layer.

8. The 3D memory device of claim 7, wherein the contact and the third conductive layer are in electric contact with a peripheral device.

9. The 3D memory device of claim 8, wherein the trench isolation structure electrically isolates the semiconductor layer under each memory stack.

10. The 3D memory device of claim 9, wherein the trench isolation structure is disposed under the first and the second isolation structures and aligns to the first and the second isolation structures.

11. The 3D memory device of claim 9, wherein the trench isolation structure is disposed under the dummy structure.

12. A system, comprising:
    a three-dimensional (3D) memory device configured to store data, the 3D memory device comprising:
        a plurality of memory stacks comprising a first memory stack and a second memory stack arranged along a first direction, each memory stack comprising:
            a plurality of first conductive layers and a plurality of first dielectric layers alternately stacked along a second direction perpendicular to the first direction; and
            a channel structure extending through the plurality of first conductive layers and the plurality of first dielectric layers along the second direction;
        a dummy structure disposed between the first memory stack and the second memory stack, the dummy structure extending along a second direction perpendicular to the first direction and a third direction perpendicular to the first direction and the second direction;
        a first isolation structure disposed between the dummy structure and the first memory stack, the first isolation structure extending along the second direction and the third direction;
        a second isolation structure disposed between the dummy structure and the second memory stack, the second isolation structure extending along the second direction and the third direction;
        a semiconductor layer disposed under the plurality of memory stacks, the dummy structure, the first isolation structure, and the second isolation structure; and a trench isolation structure disposed in the semiconductor layer extending along the second direction and the third direction; and a memory controller coupled to the 3D memory device and configured to control operations of the 3D memory device.

13. A method for forming a three-dimensional (3D) memory device, comprising:

forming a stack structure comprising a plurality of first dielectric layers and a plurality of sacrificial layers alternatingly arranged on a semiconductor layer, wherein the stack structure comprises a plurality of dielectric stacks arranged along a first direction;

forming a plurality of channel structures in the stack structure along a second direction perpendicular to the first direction;

forming a first opening and a second opening in the stack structure from an upper side of the stack structure along the second direction and a third direction perpendicular to the first direction and the second direction, wherein the plurality of dielectric stacks are zoned into a first memory region, a second memory region, and a dummy region by the first opening and the second opening, the dummy region is disposed between the first memory region and the second memory region, the first opening is disposed between the first memory region and the dummy region, and the second opening is disposed between the second memory region and the dummy region;

replacing the plurality of sacrificial layers with a plurality of conductive layers;

forming a first isolation structure in the first opening and a second isolation structure in the second opening; and forming a third isolation structure in the semiconductor layer under the first isolation structure and forming a fourth isolation structure in the semiconductor layer under the second isolation structure.

14. The method of claim 13, wherein forming the plurality of channel structures in the stack structure along the second direction, further comprises:

forming the plurality of channel structures in the first memory region, the second memory region, and the dummy region along the second direction.

15. The method of claim 13, wherein forming the plurality of channel structures in the stack structure along the second direction, further comprises:

forming the plurality of channel structures in the first memory region and the second memory region; and forming a contact structure in the dummy region along the second direction.

16. The method of claim 15, wherein forming the first isolation structure in the first opening and the second isolation structure in the second opening, further comprises:

forming a first gate line slit structure in the first opening and a second gate line slit structure in the second opening.

17. The method of claim 15, wherein forming the first isolation structure in the first opening and the second isolation structure in the second opening, further comprises:

forming a second dielectric layer in the first opening and a third dielectric layer in the second opening.

18. The method of claim 17, wherein forming the third isolation structure in the semiconductor layer under the first isolation structure and forming the fourth isolation structure in the semiconductor layer under the second isolation structure, further comprises:

forming a third opening in the semiconductor layer under the first isolation structure and the second isolation structure from a side of the semiconductor layer away from the stack structure; and forming a fourth dielectric layer in the third opening.

19. The method of claim 18, wherein the first isolation structure electrically isolates the plurality of conductive layers between the first memory region and the dummy region, and the second isolation structure electrically isolates the plurality of conductive layers between the second memory region and the dummy region.

20. The method of claim 19, wherein the third isolation structure electrically isolates the semiconductor layer under the first memory region and the dummy region, and the fourth isolation structure electrically isolates the semiconductor layer under the second memory region and the dummy region.

* * * * *